United States Patent
Yoshizaki et al.

(10) Patent No.: US 11,189,803 B2
(45) Date of Patent: Nov. 30, 2021

(54) ORGANIC ELECTROLUMINESCENT ELEMENT AND ELECTRONIC DEVICE CONTAINING THE ORGANIC ELECTROLUMINESCENT ELEMENT

(71) Applicant: IDEMITSU KOSAN CO., LTD., Chiyoda-ku (JP)

(72) Inventors: Kei Yoshizaki, Sodegaura (JP); Toshinari Ogiwara, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 226 days.

(21) Appl. No.: 16/321,642

(22) PCT Filed: Aug. 9, 2017

(86) PCT No.: PCT/JP2017/028858
§ 371 (c)(1),
(2) Date: Jan. 29, 2019

(87) PCT Pub. No.: WO2018/030446
PCT Pub. Date: Feb. 15, 2018

(65) Prior Publication Data
US 2020/0321540 A1    Oct. 8, 2020

(30) Foreign Application Priority Data
Aug. 10, 2016 (JP) .............................. JP2016-158183

(51) Int. Cl.
*H01L 51/00*    (2006.01)
*H01L 51/50*    (2006.01)

(52) U.S. Cl.
CPC ...... *H01L 51/0074* (2013.01); *H01L 51/0059* (2013.01); *H01L 51/0072* (2013.01);
(Continued)

(58) Field of Classification Search
CPC ............. H01L 51/0074; H01L 51/0059; H01L 51/5016; H01L 51/0072; H01L 51/0073; H01L 51/5072; H01L 51/5056
See application file for complete search history.

(56) References Cited

U.S. PATENT DOCUMENTS

| 2015/0188070 A1 | 7/2015 | Ogiwara et al. |
| 2016/0064677 A1 | 3/2016 | Ogiwara et al. |

(Continued)

FOREIGN PATENT DOCUMENTS

| WO | WO 2010/134352 A1 | 11/2010 |
| WO | WO 2014/013947 A1 | 1/2014 |

(Continued)

OTHER PUBLICATIONS

International Search Report dated Nov. 7, 2017 in PCT/JP2017/028858 filed on Aug. 9, 2017.

(Continued)

*Primary Examiner* — Dung A. Le
(74) *Attorney, Agent, or Firm* — Oblon, McClelland, Maier & Neustadt, L.L.P.

(57) ABSTRACT

An organic electroluminescence device includes an anode, an emitting layer, and a cathode. The emitting layer contains a first compound, a second compound, and a third compound. An ionization potential Ip1 of the first compound and an ionization potential Ip2 of the second compound satisfy the numerical expression.

$$0 \leq Ip2 - Ip1 \leq 0.8 [eV]$$

The first compound is a delayed fluorescent compound. The second compound is a fluorescent compound. The third compound has an electron mobility of $1 \times 10^{-8}$ cm$^2$/(V·s) or more.

13 Claims, 6 Drawing Sheets

(52) U.S. Cl.
CPC ...... *H01L 51/0073* (2013.01); *H01L 51/5016* (2013.01); *H01L 51/5056* (2013.01); *H01L 51/5072* (2013.01); *H01L 51/5092* (2013.01)

(56) References Cited

U.S. PATENT DOCUMENTS

| | | |
|---|---|---|
| 2016/0301014 A1 | 10/2016 | Kawamura et al. |
| 2016/0329512 A1 | 11/2016 | Nishide et al. |
| 2017/0015004 A1* | 1/2017 | Osaka .................... B25J 13/089 |
| 2017/0062731 A1* | 3/2017 | Ogiwara ............... C07D 403/14 |
| 2017/0162799 A1 | 6/2017 | Ogiwara et al. |

FOREIGN PATENT DOCUMENTS

| | | |
|---|---|---|
| WO | WO 2014/157619 A1 | 10/2014 |
| WO | WO 2015/098975 A1 | 7/2015 |
| WO | WO 2016/031785 A1 | 3/2016 |
| WO | WO 2016/125807 A1 | 8/2016 |
| WO | WO 2016/181844 A1 | 11/2016 |
| WO | WO 2017/115788 A1 | 7/2017 |

OTHER PUBLICATIONS

Sun, J. W. et al., "A Fluorescent Organic Light-Emitting Diode with 30% External Quantum Efficiency," Advanced Materials, vol. 26, No. 32, 2014, pp. 5684-5688 (7 total pages).

Jou, J-H. et al., "Carrier Modulation Layer-Enhanced Organic Light-Emitting Diodes," Molecules, vol. 20, No. 7, Jul. 2015, pp. 13005-13030.

Adachi, C. et al., "Device Physics of Organic Semiconductors," Kodansha, Apr. 2012, pp. 261-268 (with English translation).

Uoyama, H. et al., "Highly efficient organic light-emitting diodes from delayed fluorescence," Nature, vol. 492, Dec. 2012, pp. 234-238 (7 total pages).

Cui, L-S. et al., "Controlling Synergistic Oxidation Processes for Efficient and Stable Blue Thermally Activated Delayed Fluorescence Devices," Advanced Materials, Feb. 2016, pp. 1-6.

* cited by examiner

ORGANIC ELECTROLUMINESCENT ELEMENT AND ELECTRONIC DEVICE CONTAINING THE ORGANIC ELECTROLUMINESCENT ELEMENT

TECHNICAL FIELD

The present invention relates to an organic electroluminescence device and an electronic device.

BACKGROUND ART

When a voltage is applied to an organic electroluminescence device (hereinafter, occasionally referred to as "organic EL device"), holes and electrons are injected from an anode and a cathode into an emitting layer, respectively. The injected electrons and holes are recombined in the emitting layer to form excitons. Specifically, according to the electron spin statistics theory, singlet excitons and triplet excitons are generated at a ratio of 25%: 75%.

A fluorescent organic EL device with emission caused by singlet excitons, which has been applied to a full-color display for a mobile phone, TV and the like, is inferred to exhibit an internal quantum efficiency of 25% at a maximum. Use of triplet excitons in combination with singlet excitons has been expected to allow the organic EL device to emit light with higher efficiency.

In view of the above, a highly efficient fluorescent organic EL device with delayed fluorescence has been studied.

For instance, a thermally activated delayed fluorescence (TADF) mechanism has been studied. The TADF mechanism uses a phenomenon where reversed inter-system crossing (RISC) from triplet excitons to singlet excitons thermally occurs when a material having a small energy difference ($\Delta ST$) between singlet energy level and triplet energy level is used. As for thermally activated delayed fluorescence, refer to, for instance, ADACHI, Chihaya, ed. (Apr. 1, 2012), "Yuki Hando-tai no Debaisu Bussei (*Device Physics of Organic Semiconductors*)", Kodansha, pp. 261-262. Organic EL devices with such a TADF mechanism are disclosed in, for instance, Patent Literatures 1 to 3.

CITATION LIST

Patent Literature(S)

Patent Literature 1: International Publication No. 2014/013947
Patent Literature 2: International Publication No. 2015/098975
Patent Literature 3: International Publication No. 2016/031785

SUMMARY OF THE INVENTION

Problem(s) to be Solved by the Invention

An organic EL device with a TADF mechanism has been required to be highly improved in performance.

An object of the invention is to provide a high-performance organic electroluminescence device. Another object of the invention is to provide an electronic device including the organic electroluminescence device.

Means for Solving the Problem(s)

According to a first aspect of the invention, an organic electroluminescence device includes an anode, an emitting layer, and a cathode.

The emitting layer contains a first compound, a second compound, and a third compound.

An ionization potential $Ip1$ of the first compound and an ionization potential $Ip2$ of the second compound satisfy a relationship represented by a numerical expression (Numerical Expression 1) below.

The first compound is a delayed fluorescent compound.
The second compound is a fluorescent compound.
The third compound has an electron mobility of $1 \times 10^{-8}$ cm²/(V·s) or more.

$$0 \leq Ip2 - Ip1 \leq 0.8 \ [eV] \quad \text{(Numerical Expression 1)}$$

According to a second aspect of the invention, an electronic device includes the organic electroluminescence device according to the above aspect.

According to the first aspect of the invention, a high-performance organic electroluminescence device can be provided.

According to the second aspect of the invention, an electronic device including such an organic electroluminescence device can be provided.

DESCRIPTION OF EMBODIMENTS

Arrangement of Organic EL Device

An organic EL device according to an exemplary embodiment includes a pair of electrodes and an organic layer provided between the pair of electrodes. The organic layer includes at least one layer containing an organic compound. Alternatively, the organic layer is provided by laminating a plurality of layers each containing an organic compound. The organic layer may further contain an inorganic compound. In the organic EL device of the exemplary embodiment, at least one layer forming the organic layer is an emitting layer. Accordingly, the organic layer may consist of a single emitting layer or, alternatively, may further include a layer usable in organic EL devices. For instance, the layer usable in organic EL devices is at least one layer selected from the group consisting of, but not limited thereto, a hole injecting layer, a hole transporting layer, an electron injecting layer, an electron transporting layer, and a blocking layer.

The organic EL device may have one of the following typical arrangements (a) to (f).

(a) anode/emitting layer/cathode (b) anode/hole injecting•transporting layer/emitting layer/cathode (c) anode/emitting layer/electron injecting•transporting layer/cathode (d) anode/hole injecting•transporting layer/emitting layer/electron injecting•transporting layer/cathode (e) anode/hole injecting•transporting layer/emitting layer/blocking layer/electron injecting•transporting layer/cathode (f) anode/hole injecting•transporting layer/blocking layer/emitting layer/blocking layer/electron injecting•transporting layer/cathode Among the above, the arrangement (d) is preferably usable. However, the invention is not limited to these arrangements. It should be noted that the term "emitting layer" means an organic layer with a luminescent function. The term "hole injecting/transporting layer" means "at least one of a hole injecting layer and a hole transporting layer." The term "electron injecting/transporting layer" means "at least one of an electron injecting layer and an electron transporting layer." When the organic EL device includes a hole injecting layer and a hole transporting layer, the hole injecting layer is preferably provided between the hole transporting layer and the anode. When the organic EL device includes an electron injecting layer and an electron transporting layer, the electron injecting layer is preferably provided between the electron transporting layer and the cathode. Each of the hole injecting layer, the hole transporting layer, the electron transporting layer and the electron injecting layer may be in the form of a single layer or in the form of a plurality of layers.

Figure 1:
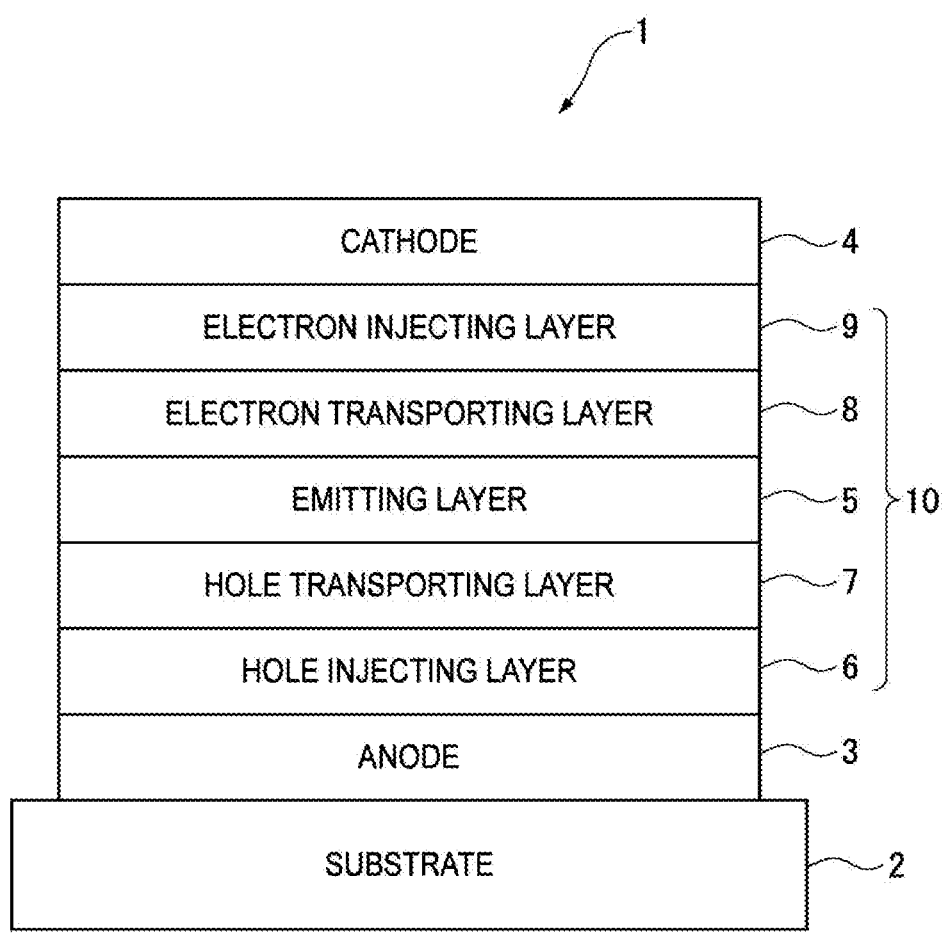
FIG. 1 schematically shows an exemplary arrangement of an organic electroluminescence device according to an exemplary embodiment of the invention.

FIG. 1 schematically shows an exemplary arrangement of the organic EL device according to the exemplary embodiment.

An organic EL device 1 includes a translucent substrate 2, an anode 3, a cathode 4, and an organic layer 10 provided between the anode 3 and the cathode 4. The organic layer 10 includes a hole injecting layer 6, a hole transporting layer 7, an emitting layer 5, an electron transporting layer 8, and an electron injecting layer 9. The organic layer 10 is provided by laminating the hole injecting layer 6, the hole transporting layer 7, the emitting layer 5, the electron transporting layer 8, and the electron injecting layer 9 on one another in this sequence from the anode 3.

Emitting Layer

The emitting layer of the organic EL device contains a first compound, a second compound, and a third compound. The emitting layer may contain a metal complex but preferably contains no metal complex. In addition, the emitting layer preferably contains no phosphorescent metal complex.

The first compound is a delayed fluorescent compound. The second compound is a fluorescent compound. The third compound has an electron mobility of $1 \times 10^{-8}$ cm$^2$/(V·s) or more.

The first compound is also preferably a host material (occasionally referred to as matrix material). The second compound is also preferably a dopant material (occasionally referred to as guest material, emitter, or luminescent material).

Combination of First Compound, Second Compound, and Third Compound

An ionization potential Ip1 of the first compound and an ionization potential Ip2 of the second compound satisfy a relationship represented by a numerical expression (Numerical Expression 1) below.

$$0 \le Ip2 - Ip1 \le 0.8 \ [eV] \quad \text{(Numerical Expression 1)}$$

The ionization potential Ip1 of the first compound and the ionization potential Ip2 of the second compound preferably satisfy a relationship represented by a numerical expression (Numerical Expression 1A) below.

$$0 \le Ip2 - Ip1 \le 0.75 \ [eV] \quad \text{(Numerical Expression 1A)}$$

According to the exemplary embodiment, a high-performance organic EL device can be provided.

In the organic EL device of the exemplary embodiment, which satisfies the relationship of the above numerical expression (Numerical Expression 1), simultaneous trapping of holes and electrons is supposed to be prevented in the fluorescent second compound. By reducing the simultaneous trapping of holes and electrons in the second compound, direct emission from the second compound is supposed to be prevented.

If holes and electrons are simultaneously trapped on the fluorescent second compound, recombination of carriers would occur on the second compound to generate excitons.

Meanwhile, in the organic EL device of the exemplary embodiment, which satisfies the relationship of the numerical expression (Numerical Expression 1), generation of excitons on the second compound is supposed to be prevented. It should be noted that if recombination of carriers occurs on the second compound, delayed fluorescence is unlikely to be achieved.

On the other hand, when the relationship of the numerical expression (Numerical Expression 1) is satisfied, an LUMO of the second compound becomes deeper (larger) than an LUMO of the first compound. Thus, the second compound would tend to trap the electrons, lowering an electron transporting capability of the emitting layer. As a result, since the number of holes in the emitting layer is increased, luminous areas would be localized near the electron injecting layer in the emitting layer, reducing the lifetime of the organic EL device.

The emitting layer of the organic EL device of the exemplary embodiment contains the first compound, the second compound, and the third compound with an electron transporting capability, so that the emitting layer is supposed to exhibit an improved electron transporting capability as compared with an emitting layer containing no third compound. This is supposed to reduce localization of the luminous areas, highly improving the performance of the organic EL device and, in particular, increasing the lifetime thereof.

It should be noted that when Ip2−Ip1>0.8 eV, the electrons are trapped on the second compound, promoting collision between the electrons and the excitons and, consequently, promoting roll-off. "Roll-off" means a phenomenon where a luminous efficiency is lowered as a result of driving the device at a high current density.

When the LUMO of the first compound is close to the LUMO of the second compound in the emitting layer of the exemplary embodiment, the electrons are unlikely to be trapped on the second compound in the emitting layer. This is favorable for achieving high performance, in particular, increasing lifetime. When the LUMO of the first compound is close to the LUMO of the second compound, respective values of ionization potential of these compounds also usually become close (a difference therebtween becomes small).

When the ionization potential Ip2 of the second compound is shallower (smaller) than the ionization potential Ip1 of the first compound (i.e., a relationship of Ip2−Ip1<0 is satisfied), holes and electrons are likely to be simultaneously trapped on the second compound, causing direct emission of the second compound.

Accordingly, the ionization potential Ip2 of the second compound is preferably equal to the ionization potential Ip1 of the first compound or deeper (larger) than the ionization potential Ip1 of the first compound (i.e., a relationship of 0≤Ip2−Ip1 is satisfied).

In addition, when a value (Ip2−Ip1) obtained by subtracting Ip2 of the first compound from Ip1 of the second compound is close to 0 eV, the LUMO of the first compound and the LUMO of the second compound become relatively close, accordingly. Thus, such ionization potentials are supposed to be preferable. For instance, a relationship as represented by the numerical expression (Numerical Expression 1) is preferably satisfied.

A difference ΔST(H) between a singlet energy $S_1(H)$ of the first compound and an energy gap $T_{77K}(H)$ at 77[K] of the first compound preferably satisfies a relationship represented by a numerical expression (Numerical Expression 2) below.

$$\Delta ST(H)=S_1(H)-T_{77K}(H)<0.3\ [eV] \quad \text{(Numerical Expression 2).}$$

When the relationship of the numerical expression (Numerical Expression 2) is satisfied, reversed inter-system crossing from the triplet level of the first compound to the singlet level thereof is supposed to be easily caused by a heat energy given from the outside. Presumably, when reversed inter-system crossing is easily caused, the luminous efficiency of the organic EL device tends to be improved with an increase in the ratio of Förster energy transfer from the first compound of the fluorescent second compound.

The difference ΔST(H) between the singlet energy $S_1(H)$ of the first compound and the energy gap $T_{77K}(H)$ at 77[K] of the first compound preferably satisfies a relationship represented by a numerical expression (Numerical Expression 2A) below, more preferably satisfies a relationship represented by a numerical expression (Numerical Expression 2B) below.

$$\Delta ST(H)=S_1(H)-T_{77K}(H)<0.2\ [eV] \quad \text{(Numerical Expression 2A)}$$

$$\Delta ST(H)=S_1(H)-T_{77K}(H)<0.1\ [eV] \quad \text{(Numerical Expression 2B)}$$

A difference ΔT(H−E) between the energy gap $T_{77K}(H)$ at 77[K] of the first compound and an energy gap $T_{77K}(E)$ at 77[K] of the third compound preferably satisfies a relationship represented by a numerical expression (Numerical Expression 3) below.

$$\Delta T(H-E)=T_{77K}(H)-T_{77K}(E)\leq 0.6[eV] \quad \text{(Numerical Expression 3).}$$

When the relationship of the numerical expression (Numerical Expression 3) is satisfied, a reduction in the luminous efficiency of the organic EL device is supposed to be inhibited.

The organic EL device containing a delayed fluorescent compound (hereinafter occasionally referred to as "TADF compound") as the first compound is supposed to theoretically achieve 100% internal quantum efficiency, since triplet excitons generated on the TADF compound are converted into singlet excitons through reversed inter-system crossing.

When the energy gap $T_{77K}(E)$ of the third compound is small as compared with the energy gap $T_{77K}(H)$ of the first compound and the difference ΔT(H−E) is a large value, triplet excitons are likely to be energy-transferred from the first compound to the third compound to be deactivated.

The organic EL device of the exemplary embodiment, which satisfies the relationship of the numerical expression (Numerical Expression 3), is supposed to inhibit deactivation of the generated triplet excitons and, consequently, inhibit a reduction in the luminous efficiency of the organic EL device.

The difference ΔT(H−E) between the energy gap $T_{77K}(H)$ at 77[K] of the first compound and the energy gap $T_{77K}(E)$ at 77[K] of the third compound preferably satisfies a relationship represented by a numerical expression (Numerical Expression 3A) below.

$$\Delta T(H-E)=T_{77K}(H)-T_{77K}(E)\leq 0.3[eV] \quad \text{(Numerical Expression 3A)}$$

A lower limit of ΔT(H−E) is not limited but ΔT(H−E) is usually supposed to be any value of −0.3 eV or more, −0.2 eV or more, −0.1 eV or more, or −0.06 eV or more.

The singlet energy $S_1(H)$ of the first compound and the singlet energy $S_1(D)$ of the second compound preferably satisfy a relationship of a numerical expression (Numerical Expression 3B) below.

$$S_1(H)>S_1(D) \quad \text{(Numerical Expression 3B)}$$

When the organic EL device of the exemplary embodiment satisfies the relationship of the numerical expression (Numerical Expression 3B), energy transfer of singlet excitons generated on the first compound to the second compound is easily caused, allowing the second compound to efficiently emit light.

First Compound

The first compound is a delayed fluorescent compound.

A luminescence quantum efficiency of the first compound is preferably 70% or less, more preferably 65% or less, further preferably 60% or less.

The luminescence quantum efficiency of the first compound is preferably 30% or more.

In the exemplary embodiment, the luminescence quantum efficiency of the first compound, which contributes to energy transfer efficiency, is preferably not extremely small. Specifically, the luminescence quantum efficiency of the first compound is preferably 30% or more. Meanwhile, when the luminescence quantum efficiency of the first compound exceeds 70%, transfer of excitation energy to the second compound is likely to compete with a process of emission from the first compound. Accordingly, the luminescence quantum efficiency of the first compound is preferably 70% or less.

In the exemplary embodiment, the first compound is also preferably at least one derivative selected from the group consisting of a carbazole derivative, biscarbazole derivative, indolocarbazole derivative, an acridine derivative, an oxazine derivative, a pyrazine derivative, a pyrimidine derivative, a triazine derivative, a dibenzofuran derivative, and dibenzothiophene derivative. These derivatives may each be independently substituted. The substituent of each derivative is not limited. For instance, the substituent of each derivative is at least one group selected from the group consisting of an aryl group having 6 to 30 ring carbon atoms, a heterocyclic group having 5 to 30 ring atoms, a trialkylsilyl group, a dialkylarylsilyl group, an alkyldiarylsilyl group, a triarylsilyl group, a fluorine atom, and a cyano group. For the trialkylsilyl group, dialkylarylsilyl group, alkyldiarylsilyl group, and triarylsilyl group listed above as the substituent, the "alkyl group" means an alkyl group having 1 to 30 carbon atoms and the "aryl group" means an aryl group having 6 to 30 ring carbon atoms.

In the exemplary embodiment, the first compound is also preferably a compound with a structure where at least one structure selected from the group consisting of a carbazole structure, a biscarbazole structure, an indolocarbazole structure, and an acridine structure is bonded to at least one structure selected from the group consisting of an oxazine structure, a pyrazine structure, a pyrimidine structure, a triazine structure, and a dibenzofuran structure. Here, the structures are single-bonded or bonded via a linking group. The linking group is preferably a phenylene structure or a meta-biphenylene structure.

The carbazole structure, indolocarbazole structure, acridine structure, oxiazine structure, pyrazine structure, pyrimidine structure, triazine structure, and dibenzofuran structure mean cyclic structures having indolocarbazole, acridine, oxiazine, pyrazine, pyrimidine, triazine, and dibenzofuran as moieties thereof, respectively.

The carbazole structure, biscarbazole structure, indolocarbazole structure, acridine structure, oxazine structure, pyrazine structure, pyrimidine structure, triazine structure, and dibenzofuran structure may each be independently substituted. The substituent of each structure is not limited. For instance, the substituent of each structure is at least one group selected from the group consisting of an aryl group having 6 to 30 ring carbon atoms, a heterocyclic group having 5 to 30 ring atoms, a trialkylsilyl group, a dialkylarylsilyl group, an alkyldiarylsilyl group, a triarylsilyl group, a fluorine atom, and a cyano group. For the trialkylsilyl group, dialkylarylsilyl group, alkyldiarylsilyl group, and triarylsilyl group listed above as the substituent, the "alkyl group" means an alkyl group having 1 to 30 carbon atoms and the "aryl group" means an aryl group having 6 to 30 ring carbon atoms.

The first compound is also preferably represented by a formula (10) below.

[Formula 1]

$$\{(B)_b(L)_c\}_d(A)_a \quad (10)$$

In the formula (10):

A is a group having a moiety selected from the group consisting of formulae (a-1) to (a-7) below;

a plurality of A are mutually the same or different;

A are bonded to each other to form a saturated or unsaturated ring or not bonded to each other;

B is a group having a moiety selected from the group consisting of formulae (b-1) to (b-6) below;

a plurality of B are mutually the same or different;

B are bonded to each other to form a saturated or unsaturated ring or not bonded to each other;

a, b and d are each independently an integer of 1 to 5;

c is an integer of 0 to 5;

when c is 0, A and B are single-bonded or spiro-bonded to each other;

when c is an integer of 1 to 5, L is a linking group selected from the group consisting of a substituted or unsubstituted aromatic hydrocarbon group having 6 to 30 ring carbon atoms and a substituted or unsubstituted heterocyclic group having 5 to 30 ring atoms;

a plurality of L are mutually the same or different; and when c is an integer of 2 to 5, a plurality of L are bonded to each other to form a saturated or unsaturated ring or not bonded to each other.

[Formula 2]

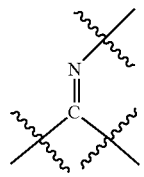 (a-1)

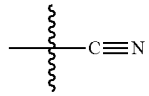 (a-2)

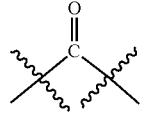 (a-3)

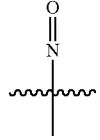 (a-4)

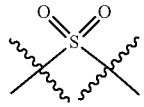 (a-5)

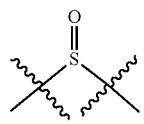 (a-6)

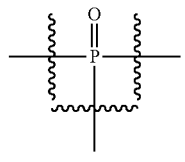 (a-7)

[Formula 3]

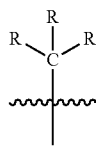 (b-1)

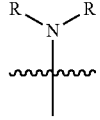 (b-2)

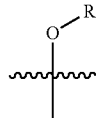 (b-3)

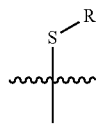 (b-4)

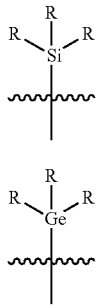

In the formulae (b-1) to (b-6):

R are each independently a hydrogen atom or a substituent, substituent R being a group selected from the group consisting of a substituted or unsubstituted aryl group having 6 to 30 ring carbon atoms, a substituted or unsubstituted heteroaryl group having 5 to 30 ring atoms, and a substituted or unsubstituted alkyl group having 1 to 30 carbon atoms;

a plurality of R are mutually the same or different; and

R are bonded to each other to form a saturated or unsaturated ring or not bonded to each other.

In the formula (10), A is an acceptor (electron-accepting) moiety and B is a donor (electron-donating) moiety.

Examples of the group having a moiety selected from the formulae (a-1) to (a-7) are shown below.

An example of the group having a moiety represented by the formula (a-3) is a group represented by a formula (a-3-1) below.

[Formula 4]

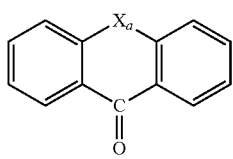

In the formula (a-3-1), $X_a$ is a single bond, an oxygen atom, a sulfur atom, or a carbon atom bonded to L or B in the formula (10).

An example of the group having a moiety represented by the formula (a-5) is a group represented by a formula (a-5-1) below.

[Formula 5]

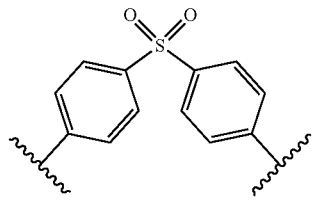

Examples of the group having a moiety selected from the formulae (b-1) to (b-6) are shown below.

An example of the group having a moiety represented by the formula (b-2) is a group represented by a formula (b-2-1) below.

[Formula 6]

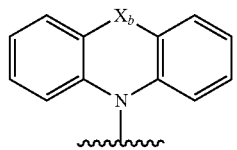

In the formula (b-2-1), $X_b$ is a single bond, an oxygen atom, a sulfur atom, $CR_{b1}R_{b2}$, or a carbon atom bonded to L or A in the formula (10).

A group represented by the formula (b-2-1) is represented by a formula (b-2-2) below when $X_b$ is a single bond, represented by a formula (b-2-3) below when $X_b$ is an oxygen atom, represented by a formula (b-2-4) below when $X_b$ is a sulfur atom, and represented by a formula (b-2-5) below when $X_b$ is $CR_{b1}R_{b2}$.

[Formula 7]

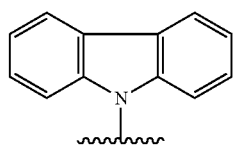

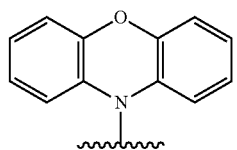

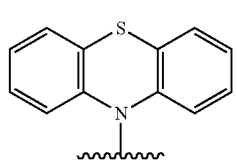

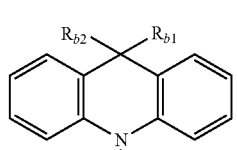

$R_{b1}$ and $R_{b2}$ are each independently a hydrogen atom or a substituent, substituent $R_{b1}$ and $R_{b2}$ being each independently a substituent selected from the group consisting of a substituted or unsubstituted alkyl group having 1 to 30 carbon atoms and a substituted or unsubstituted aryl group having 6 to 30 ring carbon atoms.

$R_{b1}$ and $R_{b2}$ are preferably each independently a substituent selected from the group consisting of a substituted or unsubstituted alkyl group having 1 to 30 carbon atoms and a substituted or unsubstituted aryl group having 6 to 30 ring carbon atoms, more preferably a substituent selected from the group consisting of a substituted or unsubstituted alkyl group having 1 to 30 carbon atoms.

A is preferably a group having at least one moiety selected from the group consisting of the formulae (a-1), (a-2), (a-3), and (a-5), more preferably a group having a moiety represented by the formula (a-1).

B is preferably a group having at least one moiety selected from the group consisting of the formulae (b-2), (b-3), and (a-4), more preferably a group having a moiety represented by the formula (b-2).

c is preferably 0, 1, or 2, particularly preferably 1.

A bonding pattern of the compound represented by the formula (10) is exemplified by bonding patterns shown in Table 1 below.

TABLE 1

| No. | a | b | c | d | Bonding Pattern |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—A—A, <br> B⟨A/A |
| (1D) | 1 | 2 | 0 | 1 | B—B—A, <br> B\A/B |
| (1E) | 2 | 1 | 1 | 1 | B—L—A—A, <br> B—L⟨A/A |
| (1F) | 1 | 2 | 1 | 1 | B—B—L—A, <br> B\L—A/B |
| (1G) | 1 | 1 | 2 | 1 | B—L—L—A |
| (1H) | 1 | 1 | 1 | 2 | B—L\A/B—L <br> B—L—B—L—A, |

B in the formula (10) is also preferably represented by a formula (100) below.

[Formula 8]

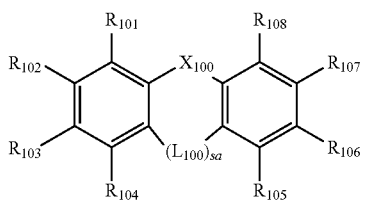

(100)

In the formula (100):

$R_{101}$ to $R_{108}$ are each independently a hydrogen atom or a substituent, substituent $R_{101}$ to $R_{108}$ being each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted silyl group, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, and a substituted or unsubstituted arylthio group having 6 to 30 ring carbon atoms, such that at least one pair of substituents selected from the group consisting of a pair of $R_{101}$ and $R_{102}$, a pair of $R_{102}$ and $R_{103}$, a pair of $R_{103}$ and $R_{104}$, a pair of $R_{105}$ and $R_{106}$, a pair of $R_{106}$ and $R_{107}$, and a pair of $R_{107}$ and $R_{108}$ are bonded to each other to form a saturated or unsaturated ring or not bonded to each other;

$L_{100}$ is a linking group selected from the group consisting of formulae (111) to (117) below;

sa is an integer of 0 to 3, a plurality of $L_{100}$ being mutually the same or different; and $X_{100}$ is a linking group selected from the group consisting of formulae (121) to (125) below.

[Formula 9]

 (111)

 (112)

 (113)

 (114)

 (115)

 (116)

 (117)

In the formulae (113) to (117), $R_{109}$ each independently represent the same as $R_{101}$ to $R_{108}$ in the formula (100). A plurality of $R_{109}$ are mutually the same or different.

It should be noted that one of $R_{101}$ to $R_{108}$ or one of $R_{109}$ in the formula (100) is a single bond to L or A in the formula (10).

In the case of a pair of $R_{108}$ and $R_{104}$ in the formula (100) or a pair of $R_{109}$ and $R_{105}$ in the formula (100), the substituents form a saturated or unsaturated ring or are not bonded to each other.

[Formula 10]

-continued

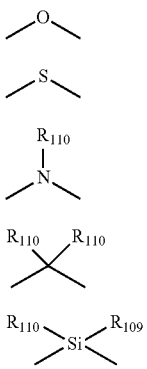

(121)

(122)

(123)

(124)

(125)

In the formulae (123) to (125):

$R_{110}$ are each independently a hydrogen atom or a substituent, substituent $R_{110}$ being selected from the group consisting of a substituted or unsubstituted aryl group having 6 to 30 ring carbon atoms, a substituted or unsubstituted heteroaryl group having 5 to 30 ring atoms, and a substituted or unsubstituted alkyl group having 1 to 30 carbon atoms; and a plurality of $R_{110}$ are mutually the same or different.

In the case of a pair of $R_{110}$ and $R_{101}$ in the formula (100) or a pair of $R_{110}$ and $R_{108}$ in the formula (100), the substituents form a saturated or unsaturated ring or are not bonded to each other.

sa in the formula (100) is preferably 0 or 1.

When sa in the formula (100) is 0, B in the formula (10) is represented by a formula (100A) below.

[Formula 11]

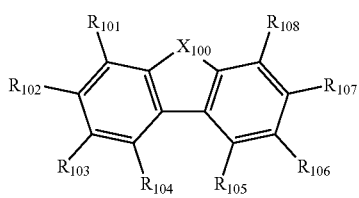

(100A)

$X_{100}$ and $R_{101}$ to $R_{108}$ in the formula (100A) represent the same as $X_{100}$ and $R_{101}$ to $R_{108}$ in the formula (100), respectively.

$L_{100}$ is preferably represented by any one of the formulae (111) to (114), more preferably represented by the formula (113) or (114).

$X_{100}$ is preferably represented by any one of the formulae (121) to (124), more preferably represented by the formula (123) or (124).

The first compound is also preferably represented by a formula (11) below. A compound represented by a formula (11) below corresponds to a compound represented by the formula (10) where a is 1, b is 1, d is 1, A is Az, and B is Cz.

[Formula 12]

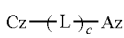

(11)

In the formula (11):

Az is a cyclic structure selected from the group consisting of a substituted or unsubstituted pyridine ring, a substituted or unsubstituted pyrimidine ring, a substituted or unsubstituted triazine ring, and a substituted or unsubstituted pyrazine ring;

c is an integer of 0 to 5;

L is a linking group selected from the group consisting of a substituted or unsubstituted aromatic hydrocarbon group having 6 to 30 ring carbon atoms and a substituted or unsubstituted heterocyclic group having 5 to 30 ring atoms;

when c is 0, Cz is single-bonded to Az;

when c is an integer of 2 to 5, a plurality of L are bonded to form a ring or form no ring;

a plurality of L are mutually the same or different; and

Cz is represented by a formula (12) below.

[Formula 13]

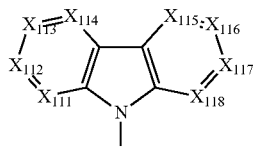

(12)

In the formula (12):

$X_{111}$ to $X_{118}$ are each independently a nitrogen atom or $C-R_A$;

$R_A$ are each independently a hydrogen atom or a substituent, substituent $R_A$ being a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group;

a plurality of $R_A$ are mutually the same or different;

when two or more of $X_{111}$ to $X_{118}$ are each $C-R_A$ and each $R_A$ is a substituent, $R_A$ are bonded to each other to form a ring or not bonded to each other; and

* represents a bonding site to a carbon atom in a structure of the linking group represented by L or a bonding site to a carbon atom in the cyclic structure represented by Az.

$X_{111}$ to $X_{118}$ is are also preferably each $C-R_A$.

c in the formula (11) is preferably 0, 1, or 2, particularly preferably 1.

In the exemplary embodiment, the first compound is also preferably represented by a formula (150) below.

[Formula 14]

-continued (150)

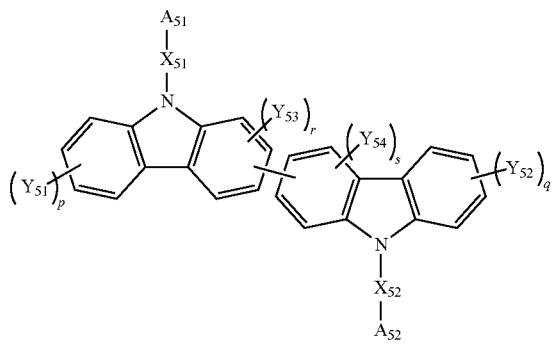

In the formula (150):

$A_{51}$ is a substituted or unsubstituted nitrogen-containing heterocyclic group having 1 to 30 ring carbon atoms;

$A_{52}$ is a substituted or unsubstituted aromatic hydrocarbon group having 6 to 30 ring carbon atoms or a substituted or unsubstituted nitrogen-containing heterocyclic group having 1 to 30 ring carbon atoms;

$X_{51}$ and $X_{52}$ are each independently a single bond or a linking group, linking group $X_{51}$ and linking group $X_{52}$ being each independently selected from the group consisting of a substituted or unsubstituted aromatic hydrocarbon group having 6 to 30 ring carbon atoms, a substituted or unsubstituted fused aromatic hydrocarbon group having 10 to 30 ring carbon atoms, a substituted or unsubstituted aromatic heterocyclic group having 2 to 30 ring carbon atoms, and a substituted or unsubstituted fused aromatic heterocyclic group having 2 to 30 ring carbon atoms;

$Y_{51}$ to $Y_{54}$ are each independently a hydrogen atom or a substituent, substituent $Y_{51}$ to $Y_{54}$ being each independently selected from the group consisting of a fluorine atom, a cyano group, a substituted or unsubstituted alkyl group having 1 to 20 carbon atoms, a substituted or unsubstituted alkoxy group having 1 to 20 carbon atoms, a substituted or unsubstituted haloalkyl group having 1 to 20 carbon atoms, a substituted or unsubstituted haloalkoxy group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aromatic hydrocarbon group having 6 to 30 ring carbon atoms, and a substituted or unsubstituted heterocyclic group having 5 to 30 ring atoms;

p is an integer of 1 to 4, q is an integer of 1 to 4, r is an integer of 1 to 3, and s is an integer of 1 to 3;

a plurality of $Y_{51}$ are mutually the same or different;
$Y_{51}$ are bonded to each other to form a cyclic structure or not bonded;
a plurality of $Y_{52}$ are mutually the same or different;
$Y_{52}$ are bonded to each other to form a cyclic structure or not bonded;
a plurality of $Y_{53}$ are mutually the same or different;
$Y_{53}$ are bonded to each other to form a cyclic structure or not bonded;
a plurality of $Y_{54}$ are mutually the same or different; and
$Y_{54}$ are bonded to each other to form a cyclic structure or not bonded.

In the exemplary embodiment, the first compound is also preferably represented by a formula (151) below.

[Formula 15]

(151)

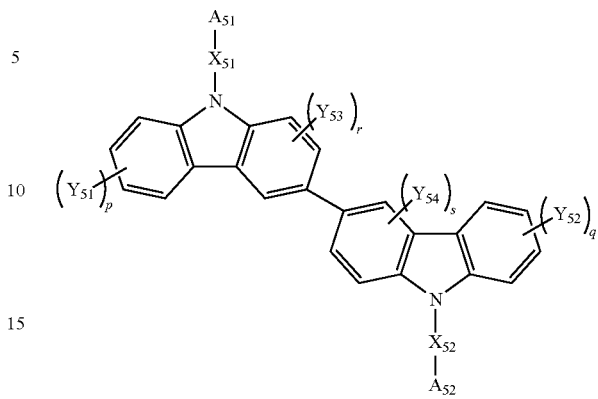

In the formula (151), $A_{51}$, $A_{52}$, $X_{51}$, $X_{52}$, $Y_{51}$ to $Y_{54}$, p, q, r, and s represent the same as $A_{51}$, $A_{52}$, $X_{51}$, $X_{52}$, $Y_{51}$ to $Y_{54}$, p, q, r, and s in the formula (150), respectively.

$A_{51}$ is preferably selected from the group consisting of a substituted or unsubstituted pyridine ring, a substituted or unsubstituted pyrimidine ring, and a substituted or unsubstituted triazine ring, more preferably selected from the group consisting of a substituted or unsubstituted pyrimidine ring and a substituted or unsubstituted triazine ring.

$A_{51}$ is also preferably a substituted or unsubstituted pyrimidine ring.

In the exemplary embodiment, the first compound is also preferably represented by a formula (152) below.

[Formula 16]

(152)

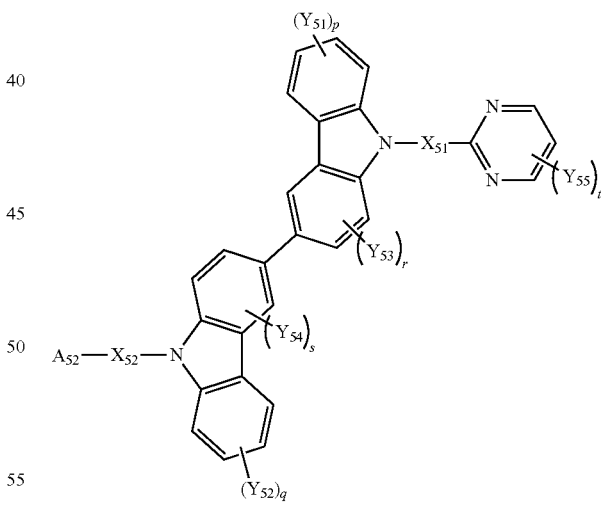

In the formula (152):

$A_{52}$, $X_{51}$, $X_{52}$, $Y_{51}$ to $Y_{54}$, p, q, r, and s represent the same as $A_{52}$, $X_{51}$, $X_{52}$, $Y_{51}$ to $Y_{54}$, p, q, r, and s in the formula (150), respectively;

$Y_{55}$ represents the same as $Y_{51}$ to $Y_{54}$ in the formula (150); and t is an integer of 1 to 3 and a plurality of $Y_{55}$ are mutually the same or different.

In the formula (150) and the formula (151), $A_{51}$ is also preferably a substituted or unsubstituted quinazoline ring.

$Y_{51}$ to $Y_{54}$ are each independently a hydrogen atom or a substituent, substituent $Y_{51}$ to $Y_{54}$ being also preferably each independently selected from the group consisting of a fluorine atom, a cyano group, a substituted or unsubstituted alkyl group having 1 to 20 carbon atoms, a substituted or unsubstituted alkylsilyl group having 1 to 10 carbon atoms, a substituted or unsubstituted arylsilyl group having 6 to 30 carbon atoms, a substituted or unsubstituted aromatic hydrocarbon group having 6 to 30 ring carbon atoms, and a substituted or unsubstituted heterocyclic group having 5 to 30 ring atoms. $Y_{51}$ to $Y_{54}$ are also preferably each a hydrogen atom. Substituent $Y_{51}$ to $Y_{54}$ are particularly preferably each independently selected from the group consisting of a cyano group, a substituted or unsubstituted alkyl group having 1 to 20 carbon atoms, a substituted or unsubstituted aromatic hydrocarbon group having 6 to 30 ring carbon atoms, and a substituted or unsubstituted heterocyclic group having 5 to 30 ring atoms.

linking group $X_{51}$ and linking group $X_{52}$ are also preferably each independently selected from the group consisting of a substituted or unsubstituted aromatic hydrocarbon group having 6 to 30 ring carbon atoms and a substituted or unsubstituted fused aromatic heterocyclic group having 2 to 30 ring carbon atoms.

linking group $X_{51}$ and linking group $X_{52}$ are more preferably each independently a substituted or unsubstituted aromatic hydrocarbon group having 6 to 30 ring carbon atoms.

$X_{51}$ and $X_{52}$ are also preferably each a single bond.

A specific example of the first compound of the exemplary embodiment is shown below. It should be noted that the first compound according to the invention is not limited to this example.

[Formula 17]

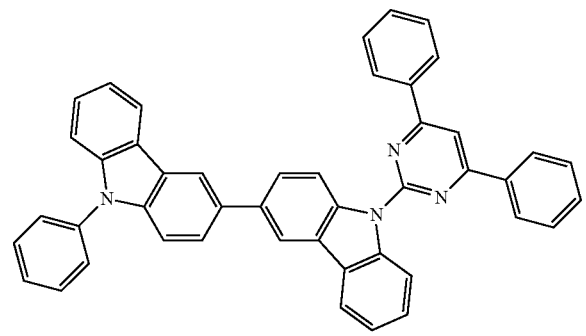

Delayed Fluorescence

Delayed fluorescence (thermally activated delayed fluorescence) is explained in "*Yuki Hando-tai no Debaisu Bussei (Device Physics of Organic Semiconductors)*" (ADACHI, Chihaya, ed., published by Kodansha), pp. 261-268. According to this literature, reducing an energy gap $\Delta E_{13}$ between the singlet state and the triplet state of a luminescent material highly possibly enables a reverse energy transfer from the triplet state to the singlet state, which usually occurs with a low transition probability, thus achieving thermally activated delayed fluorescence (thermally activated delayed fluorescence, TADF). Further, FIG. 10.38 in this literature illustrates a mechanism for occurrence of delayed fluorescence. The first compound according to the exemplary embodiment is a compound allowing for thermally activated delayed fluorescence based on this mechanism. Emission of delayed fluorescence can be determined by transient PL (Photo Luminescence) measurement.

A behavior of delayed fluorescence can be analyzed with reference to a decay curve obtained by the transient PL measurement. According to the transient PL measurement, a sample is irradiated with a pulsed laser to be excited and a decay behavior (transient property) of PL emission appearing after the irradiation is stopped is measured. The PL emission of a TADF material is divided into a luminescence component from singlet excitons generated by the first PL excitation and a luminescence component from singlet excitons generated through transition to triplet excitons. The singlet excitons generated by the first PL excitation has a considerably short lifetime in a nanosecond order. Luminescence from the singlet excitons thus decays immediately after the irradiation with the pulsed laser.

In contrast, delayed fluorescence, which is luminescence from the singlet excitons generated through transition to long-life triplet excitons, gradually decays. In other words, the luminescence from the singlet excitons generated by the first PL excitation is considerably different in time from the luminescence from the singlet excitons generated through transition to the triplet excitons. A luminous intensity derived from delayed fluorescence can thus be calculated.

Figure 2:
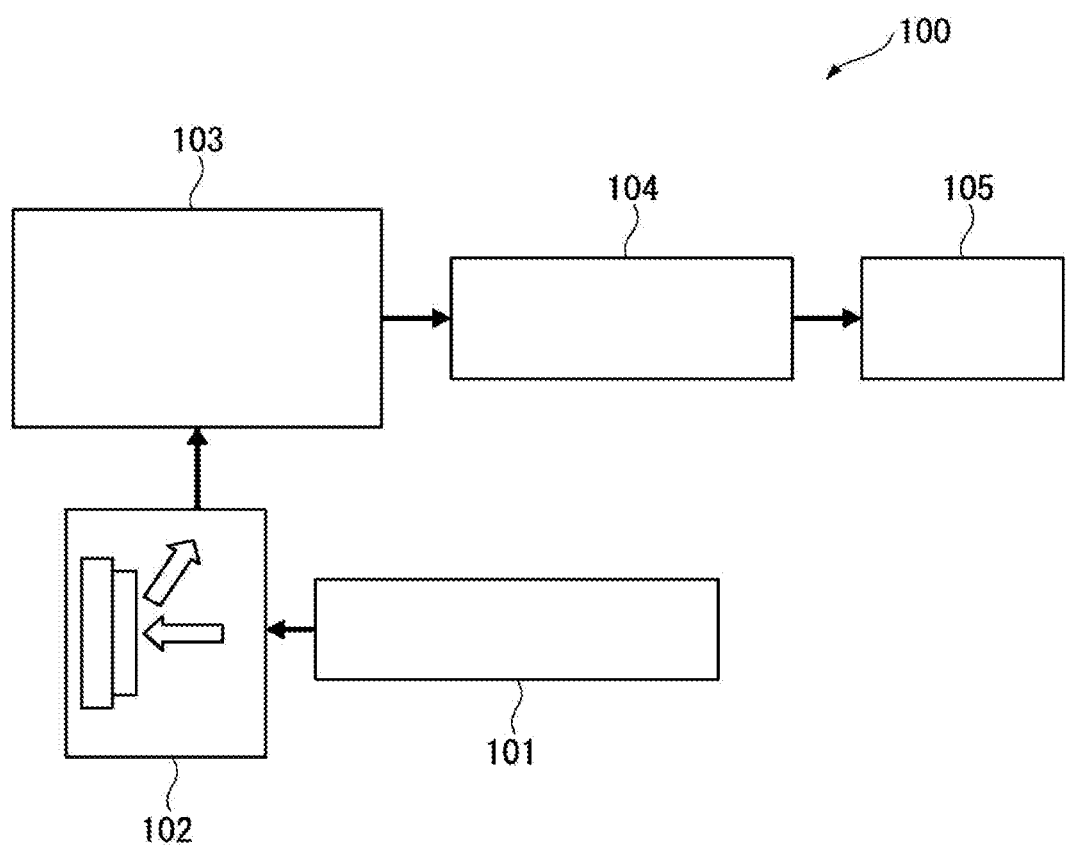
FIG. 2 schematically shows a device for measuring transient PL.

FIG. 2 schematically shows an exemplary device for the transient PL measurement.

A transient PL measuring device 100 according to the exemplary embodiment includes a pulse laser unit 101 configured to radiate light with a predetermined wavelength, a sample chamber 102 configured to house a measurement sample, a spectrometer 103 configured to disperse light emitted from the measurement sample, a streak camera 104 configured to form a two-dimensional image, and a personal computer 105 configured to import and analyze the two-dimensional image. It should be noted that the transient PL measurement may be performed by a device different from the device according to the exemplary embodiment.

The sample being housed in the sample chamber 102 is obtained by forming a thin film on a quartz substrate, the thin film being made of a matrix material doped with a doping material at a concentration of 12 mass %.

The thus-obtained thin film sample in the sample chamber 102 is irradiated with a pulsed laser from the pulse laser unit 101 to excite the doping material. Luminescence is sampled in a 90-degree direction relative to a radiation direction of the excitation light. The sampled luminescence is dispersed by the spectrometer 103 and turned into a two-dimensional image through the streak camera 104. The above process can provide a two-dimensional image in which an ordinate axis represents time, an abscissa axis represents wavelength, and a bright spot represents a luminous intensity (also referred to as "luminous intensity"). When the thus-obtained two-dimensional image is taken out at a predetermined time axis, a luminescence spectrum in which an ordinate axis represents luminous intensity and an abscissa axis represents wavelength can be obtained. Moreover, when the two-dimensional image is taken out at a wavelength axis, a decay curve (transient PL) in which an ordinate axis represents a logarithm of luminous intensity and an abscissa axis represents time can be obtained.

For instance, the transient PL measurement was performed on a thin film sample A prepared as described above using a reference compound M1 below as the matrix material and a reference compound DP1 below as the doping material.

[Formula 18]

Reference Compound M1

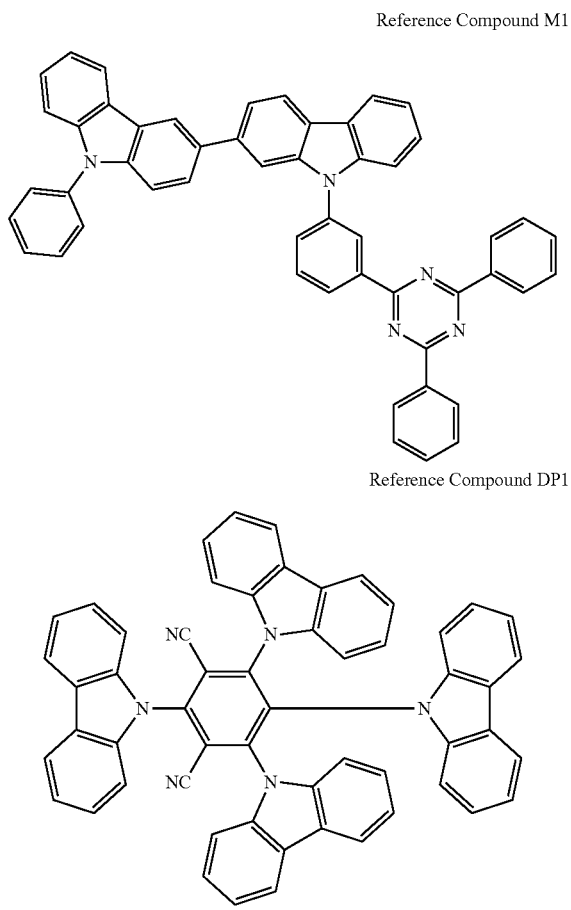

Reference Compound DP1

Decay curves obtained using the thin film sample A and a thin film sample B were analyzed. The thin film sample B was prepared in the same manner as described above using a reference compound M2 below as the matrix material and the reference compound DP1 as the doping material.

Figure 3:
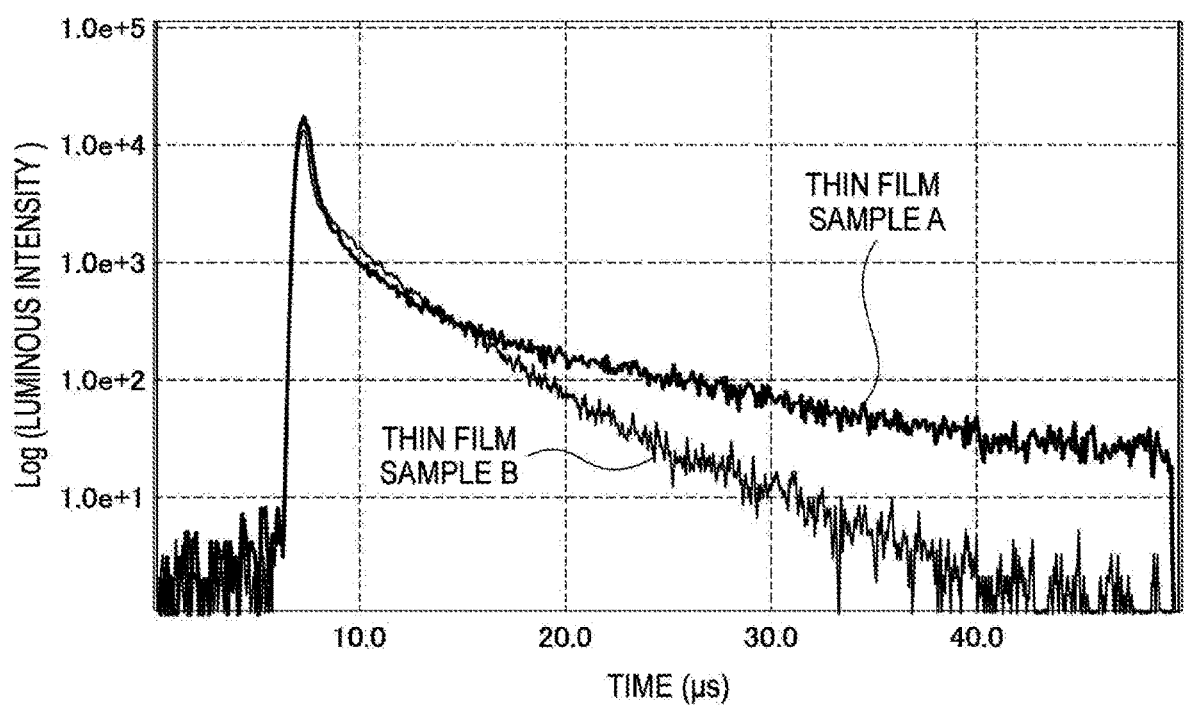
FIG. 3 shows an example of a decay curve of the transient PL.

FIG. 3 shows the decay curve resulting from the transient PL measurement of each of the thin film sample A and the thin film sample B.

[Formula 19]

Reference Compound M2

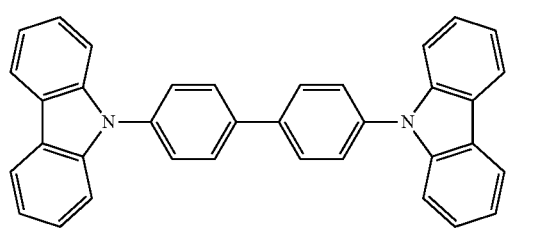

As described above, the transient PL measurement can determine a luminescence decay curve in which an ordinate axis represents luminous intensity and an abscissa axis represents time. With reference to the luminescence decay curve, a fluorescence intensity ratio between fluorescence emitted from a singlet state generated by light excitation and delayed fluorescence emitted from a singlet state generated via a triplet state by reverse energy transfer can be estimated. In a delayed fluorescence material, a ratio of the intensity of the slowly decaying delayed fluorescence to the intensity of the promptly decaying fluorescence is relatively large.

In the exemplary embodiment, an amount of the delayed fluorescence can be determined by the device shown in FIG. 2. The first compound allows for Prompt emission, which is observed immediately when the excited state is achieved by exciting the first compound with pulsed light (i.e., light emitted from the pulse laser unit) having a wavelength absorbable into the first compound, and Delay emission, which is observed not immediately upon the excitation but after a while. In the exemplary embodiment, the amount of Delay emission is preferably 5% or more with respect to the amount of Prompt emission. Specifically, when the amount of Prompt emission is denoted by $X_P$ and the amount of Delay emission is denoted by $X_D$, a value of $X_D/X_P$ is preferably 0.05 or more.

The respective amounts of Prompt emission and Delay emission can be determined by the same method as described in "Nature 492, 234-238, 2012." It should be noted that the respective amounts of Prompt emission and Delay emission may be calculated by a device different from the device disclosed in the above literature.

A sample for measuring delayed fluorescence may be prepared by co-depositing the first compound and a compound TH-2 below on a quartz substrate at a ratio of the first compound of 12 mass % to form a 100-nm-thick thin film.

[Formula 20]

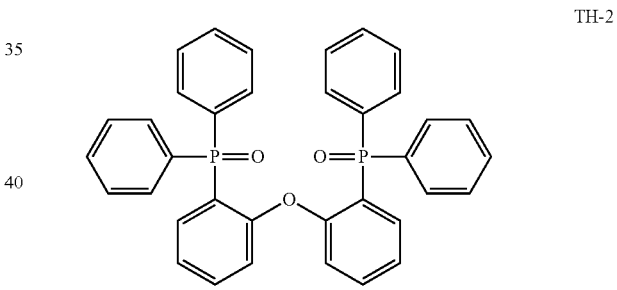

TH-2

Second Compound

The second compound is a fluorescent compound.

A main peak wavelength (occasionally referred to as "emission peak wavelength") of the second compound is preferably 550 nm or less, more preferably in a range from 430 nm to 550 nm, further more preferably in a range from 430 nm to 480 nm, particularly preferably in a range from 445 nm to 480 nm. The main peak wavelength means a peak wavelength of a luminescence spectrum with a maximum luminous intensity among luminous spectra measured using a toluene solution in which the second compound is dissolved at a concentration ranging from $10^{-6}$ mol/l to $10^{-6}$ mol/l.

The second compound preferably emits green or blue fluorescence. The second compound preferably emits blue fluorescence.

In the exemplary embodiment, the second compound is also preferably at least one compound selected from the group consisting of a bisarylamino naphthalene derivative, an aryl-substituted naphthalene derivative, a bisarylamino anthracene derivative, an aryl-substituted anthracene derivative, a bisarylamino pyrene derivative, an aryl-substituted pyrene derivative, a bisarylamino chrysene derivative, an aryl-substituted chrysene derivative, a bisarylamino fluoranthene derivative, an aryl-substituted fluoranthene derivative, an indenoperylene derivative, an acenaphthofluoranthene derivative, a pyrromethene boron complex compound, a compound with a pyrromethene skeleton, a metal complex of a compound with a pyrromethene skeleton, a diketopyrrolopyrrole derivative, a perylene derivative, and a naphthacene derivative.

In the exemplary embodiment, the second compound is also preferably at least one compound selected from the group consisting of a bisarylamino naphthalene derivative, a bisarylamino anthracene derivative, a bisarylamino pyrene derivative, a bisarylamino chrysene derivative, and a bisarylamino fluoranthene derivative.

In the exemplary embodiment, the second compound is also preferably a compound represented by a formula (22) below.

[Formula 21]

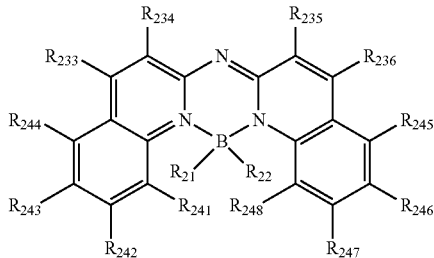

(22)

In the formula (22), $R_{233}$ to $R_{236}$ and $R_{241}$ to $R_{248}$ are each independently a hydrogen atom or a substituent, substituent $R_{233}$ to $R_{236}$ and substituent $R_{241}$ to $R_{248}$ being each independently a group selected from the group consisting of a halogen atom, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group. Substituent $R_{233}$ to $R_{236}$ and substituent $R_{241}$ to $R_{248}$ are mutually the same or different.

Substituent $R_{233}$ and substituent $R_{234}$ are directly bonded to each other to form a ring, bonded to each other via a hetero atom to form a ring, or not bonded.

Substituent $R_{235}$ and substituent $R_{236}$ are directly bonded to each other to form a ring, bonded to each other via a hetero atom to form a ring, or not bonded.

Substituent $R_{236}$ and substituent $R_{245}$ are directly bonded to each other to form a ring, bonded to each other via a hetero atom to form a ring, or not bonded.

Substituent $R_{245}$ and substituent $R_{246}$ are directly bonded to each other to form a ring, bonded to each other via a hetero atom to form a ring, or not bonded.

Substituent $R_{246}$ and substituent $R_{247}$ are directly bonded to each other to form a ring, bonded to each other via a hetero atom to form a ring, or not bonded.

Substituent $R_{247}$ and substituent $R_{248}$ are directly bonded to each other to form a ring, bonded to each other via a hetero atom to form a ring, or not bonded.

Substituent $R_{241}$ and substituent $R_{242}$ are directly bonded to each other to form a ring, bonded to each other via a hetero atom to form a ring, or not bonded.

Substituent $R_{242}$ and substituent $R_{243}$ are directly bonded to each other to form a ring, bonded to each other via a hetero atom to form a ring, or not bonded.

Substituent $R_{243}$ and substituent $R_{244}$ are directly bonded to each other to form a ring, bonded to each other via a hetero atom to form a ring, or not bonded.

Substituent $R_{244}$ and substituent $R_{233}$ are directly bonded to each other to form a ring, bonded to each other via a hetero atom to form a ring, or not bonded.

$R_{21}$ and $R_{22}$ are each independently a hydrogen atom or a substituent, substituent $R_{21}$ and $R_{22}$ being each independently a group selected from the group consisting of a halogen atom, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group.

Substituent $R_{21}$ and $R_{22}$ are directly bonded to each other to form a ring or not bonded.

In the formula (22), $R_{241}$, $R_{242}$, $R_{244}$, $R_{245}$, $R_{247}$ and $R_{248}$ are preferably each a hydrogen atom while $R_{243}$ and $R_{246}$ are each a substituent. In this case, substituent $R_{243}$ and $R_{246}$ are preferably each independently a group selected from the group consisting of a halogen atom, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group.

Substituent $R_{243}$ and $R_{246}$ are preferably each independently selected from the group consisting of a halogen atom, a substituted or unsubstituted aryl group having 6 to 30 ring carbon atoms and a substituted or unsubstituted alkyl group having 1 to 30 carbon atoms.

Substituent $R_{243}$ and $R_{246}$ are more preferably each independently a substituted or unsubstituted aryl group having 6 to 30 ring carbon atoms.

In the formula (22), $R_{21}$ and $R_{22}$ are preferably each independently a substituent selected from the group consisting of a halogen atom, a substituted or unsubstituted aryl group having 6 to 30 ring carbon atoms and a substituted or unsubstituted alkyl group having 1 to 30 carbon atoms. $R_{21}$ and $R_{22}$ are more preferably each a halogen atom, further preferably a fluorine atom.

Specific examples of the second compound of the exemplary embodiment are shown below. It should be noted that the second compound according to the invention is not limited to these examples.

[Formula 22]

[Formula 23]

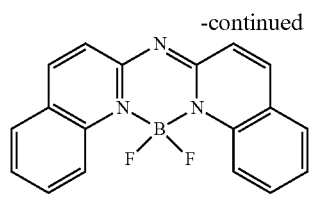

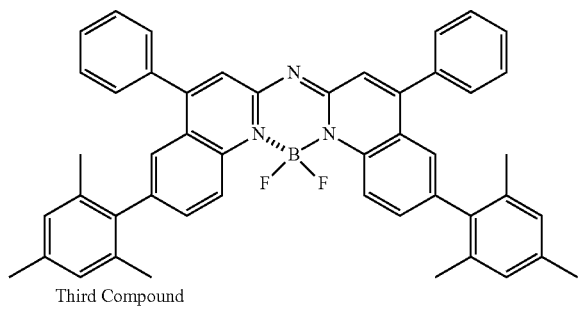
Third Compound

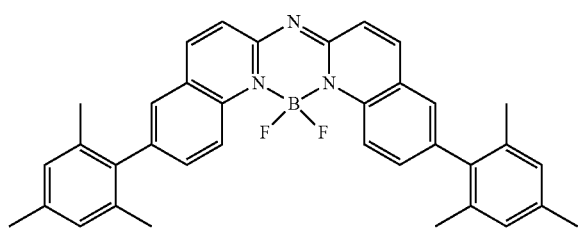

The third compound has an electron mobility of $1 \times 10^{-8}$ cm$^2$/(V·s) or more.

The third compound preferably has an electron mobility of $1 \times 10^{-7}$ cm$^2$/(V·s) or more.

In the exemplary embodiment, the third compound may be a delayed fluorescent compound.

In the exemplary embodiment, the third compound may not be a delayed fluorescent compound.

The organic EL device of the exemplary embodiment may include an organic layer (also referred to as "adjacent layer") bordering on a cathode side of the emitting layer, the third compound contained in the emitting layer being optionally different from a compound contained in the adjacent layer. Alternatively, in the exemplary embodiment, the third compound contained in the emitting layer may be the same as the compound contained in the adjacent layer.

In the exemplary embodiment, the third compound is also preferably represented by a formula (30) below.

[Formula 24]

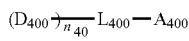 (30)

In the formula (30):

$D_{400}$ is a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a substituted amino group, a cyano group, a nitro group, and a carboxy group;

$n_{40}$ is an integer of 1 to 5;

a plurality of $D_{400}$ are mutually the same or different;

$L_{400}$ is a single bond or a linking group; and $A_{400}$ is a cyano group, a substituted or unsubstituted heteroaryl group having 5 to 30 ring atoms that contains one or more nitrogen atoms in a ring, or an aryl group having 6 to 30 ring carbon atoms that is substituted with one or more cyano groups.

Linking group $L_{400}$ is preferably a group derived from a five-membered ring, a six-membered ring, or a seven-membered ring or a group selected from the group consisting of a substituted or unsubstituted aromatic hydrocarbon group having 6 to 30 ring carbon atoms and a substituted or unsubstituted aromatic heterocyclic group having 5 to 30 ring atoms.

In the exemplary embodiment, the third compound is also preferably represented by a formula (40) below.

[Formula 25]

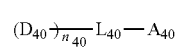 (40)

In the formula (40):

$D_{40}$ is a group represented by a formula (41) below;

$n_{40}$ is an integer of 1 to 5;

a plurality of $D_{400}$ are mutually the same or different;

$L_{40}$ is a single bond or a linking group, linking group $L_{40}$ being selected from the group consisting of a substituted or unsubstituted aromatic hydrocarbon group having 6 to 30 ring carbon atoms and a substituted or unsubstituted aromatic heterocyclic group having 5 to 30 ring atoms; and $A_{40}$ is a cyano group or a group represented by a formula (42) below.

[Formula 26]

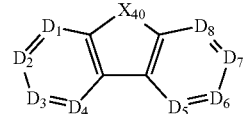 (41)

[Formula 27]

 (42)

In the formula (41):

$D_1$ to $D_8$ are each independently a carbon atom bonded to $L_{40}$ or a carbon atom bonded to $R_{40}$, $R_{40}$ being a hydrogen atom or a substituent;

a plurality of $R_{40}$ are mutually the same or different;

$X_{40}$ is an oxygen atom, a sulfur atom, a nitrogen atom bonded to $R_{41}$, or a nitrogen atom bonded to $L_{40}$, $R_{41}$ is a hydrogen atom or a substituent; and one of $D_1$ to $D_8$ is a carbon atom bonded to $L_{40}$ or $X_{40}$ is a nitrogen atom bonded to $L_{40}$.

In the formula (42):

$A_{41}$ to $A_{46}$ are each independently a nitrogen atom, a carbon atom bonded to $L_{40}$, or a carbon atom bonded to $R_{42}$;

$R_{42}$ is a hydrogen atom or a substituent;

a plurality of $R_{42}$ are mutually the same or different;

one of $A_{41}$ to $A_{46}$ is a carbon atom bonded to $L_{40}$ and at least one of the rest of $A_{41}$ to $A_{46}$ is a nitrogen atom or a carbon atom bonded to a cyano group;

substituent $R_{40}$, substituent $R_{41}$, and substituent $R_{42}$ are each independently selected from the group consisting of a fluorine atom, a cyano group, a substituted or unsubstituted alkyl group having 1 to 30 carbon atoms, a substituted or unsubstituted alkoxy group having 1 to 30 carbon atoms, a substituted or unsubstituted haloalkyl group having 1 to 30 carbon atoms, a substituted or unsubstituted haloalkoxy group having 1 to 30 carbon atoms, a substituted or unsubstituted alkylsilyl group having 1 to 10 carbon atoms, a substituted or unsubstituted arylsilyl group having 6 to 30 carbon atoms, a substituted or unsubstituted aryl group having 6 to 30 ring carbon atoms, and a substituted or unsubstituted heteroaryl group having 5 to 30 ring atoms.

In the formula (41), when one of $D_1$ to $D_8$ is a carbon atom bonded to $L_{40}$, $X_{40}$ is an oxygen atom, a sulfur atom, or a nitrogen atom bonded to $R_{41}$.

In the formula (41), when $X_{40}$ is a nitrogen atom bonded to $L_{40}$, $D_1$ to $D_8$ are each a carbon atom bonded to $R_{40}$, $R_{40}$ is a hydrogen atom or a substituent, and a plurality of $R_{40}$ are mutually the same or different.

In the exemplary embodiment, the third compound is also preferably represented by a formula (43) below.

[Formula 28]

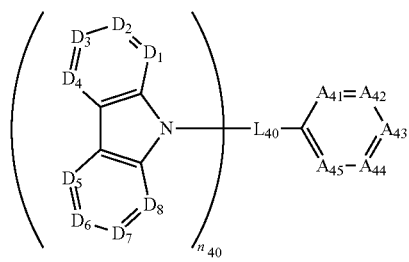

(43)

In the formula (43):

$D_1$ to $D_8$ are each independently a carbon atom bonded to $R_{40}$;

$R_{40}$ is a hydrogen atom or a substituent;

$n_{40}$ is an integer of 1 to 5;

a plurality of $R_{40}$ are mutually the same or different;

$A_{41}$ to $A_{45}$ are each a nitrogen atom or a carbon atom bonded to $R_{42}$;

$R_{42}$ is a hydrogen atom or a substituent;

a plurality of $R_{42}$ are mutually the same or different;

one of $A_{41}$ to $A_{45}$ is a nitrogen atom or a carbon atom bonded to a cyano group;

substituent $R_{40}$ and substituent $R_{42}$ each independently represent the same as above; and $L_{40}$ is a single bond or a linking group, linking group $L_{40}$ representing the same as above.

In the exemplary embodiment, the third compound is also preferably represented by a formula (44) below.

[Formula 29]

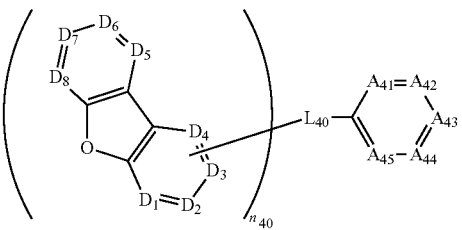

(44)

In the formula (44):

$D_1$ to $D_4$ are each independently a carbon atom bonded to $L_{40}$ or a carbon atom bonded to $R_{40}$, one of $D_1$ to $D_4$ is a carbon atom bonded to $L_{40}$;

$D_5$ to $D_8$ are each independently a carbon atom bonded to $R_{40}$;

$R_{40}$ is a hydrogen atom or a substituent;

$n_{40}$ is an integer of 1 to 5;

a plurality of $R_{40}$ are mutually the same or different;

$A_{41}$ to $A_{45}$ are each a nitrogen atom or a carbon atom bonded to $R_{42}$;

$R_{42}$ is a hydrogen atom or a substituent;

a plurality of $R_{42}$ are mutually the same or different;

one of $A_{41}$ to $A_{45}$ is a nitrogen atom or a carbon atom bonded to a cyano group;

substituent $R_{40}$ and substituent $R_{42}$ each independently represent the same as above; and $L_{40}$ is a single bond or a linking group, linking group $L_{40}$ representing the same as above.

$n_{40}$ is preferably an integer of 1 to 3, more preferably an integer of 1 to 2.

$L_{40}$ is preferably a linking group. Linking group $L_{40}$ is preferably a substituted or unsubstituted aromatic hydrocarbon group having 6 to 30 ring carbon atoms, more preferably a substituted or unsubstituted aromatic hydrocarbon group having 6 to 10 ring carbon atoms, further preferably a substituted or unsubstituted phenylene group.

When the energy gap of the third compound is large, the LUMO of the first compound and the LUMO of the second compound are deep (large) as compared with the LUMO of the third compound. The first compound and the second compound thus tend to trap electrons in the emitting layer, possibly lowering the electron transporting capability of the emitting layer. As a result, since the number of holes in the emitting layer is increased, luminous areas would be localized near the electron injecting layer in the emitting layer, reducing the lifetime of the organic EL device.

Accordingly, the third compound is preferably a compound with a small energy gap and more preferably, in order to reduce the energy gap, has a structure where the structure represented by $A_{40}$ is connected to the structure represented by $D_{40}$ via $L_{40}$ (linking group).

In the exemplary embodiment, the third compound is also preferably represented by a formula (31) below.

[Formula 30]

(31)

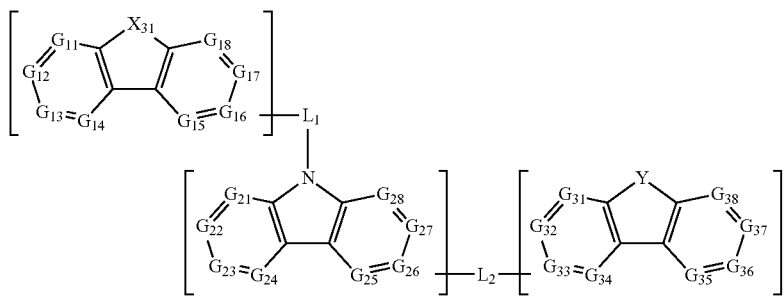

In the formula (31):

at least one of $G_{11}$ to $G_{18}$ is a nitrogen atom, one of the rest of $G_{11}$ to $G_{18}$ is a carbon atom bonded to $L_1$, and the others of $G_{11}$ to $G_{18}$ are each $C(R_1)$; $C(R)$ is a carbon atom where R is bonded;

one of $G_{21}$ to $G_{28}$ is a carbon atom bonded to $L_2$ and the rest of $G_{21}$ to $G_{28}$ are each $C(R_2)$ or a nitrogen atom;

one of $G_{31}$ to $G_{38}$ is a carbon atom bonded to $L_2$ and the rest of $G_{31}$ to $G_{38}$ are each $C(R_3)$ or a nitrogen atom;

$R_1$ to $R_3$ are each independently a hydrogen atom or a substituent;

substituent $R_1$, substituent $R_2$, and substituent $R_3$ are each independently a substituted or unsubstituted alkyl group having 1 to 20 carbon atoms, a substituted or unsubstituted cycloalkyl group having 3 to 20 ring carbon atoms, a substituted or unsubstituted cycloalkoxy group having 3 to 20 ring carbon atoms, a substituted or unsubstituted alkoxy group having 1 to 20 carbon atoms, a substituted or unsubstituted aryl group having 6 to 18 ring carbon atoms, a substituted or unsubstituted heteroaryl group having 5 to 18 ring atoms, a substituted or unsubstituted aryloxy group having 6 to 18 ring carbon atoms, a substituted or unsubstituted amino group having 0 to 20 carbon atoms, a substituted or unsubstituted silyl group having 0 to 30 carbon atoms, a fluoro group, or a cyano group;

a plurality of $R_1$ are mutually the same or different;
a plurality of $R_2$ are mutually the same or different;
a plurality of $R_3$ are mutually the same or different;

when $R_1$ is substituted, when $R_2$ is substituted, and/or when $R_3$ is substituted, substituents are each independently at least one substituent selected from the group consisting of an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aryl group having 6 to 18 ring carbon atoms, a heteroaryl group having 5 to 18 ring atoms, an aryloxy group having 6 to 18 ring carbon atoms, an amino group having 0 to 20 carbon atoms, a silyl group having 0 to 30 carbon atoms, a fluoro group, and a cyano group;

$X_{31}$ is an oxygen atom, a sulfur atom, or —N($R_4$)—;

$R_4$ is a hydrogen atom or a substituent, substituent $R_4$ being an alkyl group having 1 to 20 carbon atoms, a cycloalkyl group having 3 to 20 ring carbon atoms, an aryl group having 6 to 18 ring carbon atoms, or a heteroaryl group having 5 to 18 ring atoms;

$L_1$ is a single bond, an alkylene group having 1 to 20 carbon atoms, a cycloalkylene group having 3 to 20 ring carbon atoms, an arylene group having 6 to 18 ring carbon atoms, or a heteroarylene group having 5 to 18 ring atoms;

$L_2$ is a single bond, an alkylene group having 1 to 20 carbon atoms, a cycloalkylene group having 3 to 20 ring carbon atoms, an arylene group having 6 to 18 ring carbon atoms, a heteroarylene group having 5 to 18 ring atoms, a divalent linking group containing a nitrogen atom, a divalent linking group containing an oxygen atom, a divalent linking group containing a silicon atom, a divalent linking group containing a phosphorus atom, or a divalent linking group containing a sulfur atom;

Y is an oxygen atom, a sulfur atom, or —N(-$L_3$-$R_5$)—;

$L_3$ is a single bond, an alkylene group having 1 to 20 carbon atoms, a cycloalkylene group having 3 to 20 ring carbon atoms, an arylene group having 6 to 18 ring carbon atoms, or a heteroarylene group having 5 to 18 ring atoms;

$R_5$ is a hydrogen atom, an alkyl group having 1 to 20 carbon atoms, a cycloalkyl group having 3 to 20 ring carbon atoms, an aryl group having 6 to 18 ring carbon atoms, or a heteroaryl group having 5 to 18 ring atoms;

when $X_{31}$ is an oxygen atom or a sulfur atom, only one of $G_{11}$ to $G_{18}$ is a nitrogen atom; and when $X_{31}$ is —N($R_4$)—, Y is —N(-$L_3$-$R_5$)— and $R_2$ and $R_3$ are each a hydrogen atom.

In the formula (31), $X_{31}$ is preferably an oxygen atom or a sulfur atom.

In the formula (31), $X_{31}$ is also preferably —N($R_4$)—.

In the formula (31), $G_{16}$ is preferably a carbon atom bonded to $L_1$.

In the formula (31), $G_{26}$ and $G_{33}$ are each a carbon atom bonded to $L_2$.

In the exemplary embodiment, the third compound is also preferably represented by a formula (32) below.

[Formula 31]

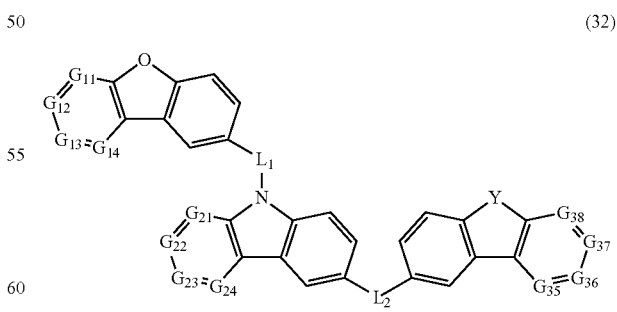

(32)

In the formula (32):

one of $G_{11}$ to $G_{14}$ is a nitrogen atom and the rest of $G_{11}$ to $G_{14}$ are each $C(R_1)$;

$G_{21}$ to $G_{24}$ are each $C(R_2)$ or a nitrogen atom;

$G_{35}$ to $G_{38}$ are each $C(R_3)$ or a nitrogen atom;

$R_1$ to $R_3$ are each independently a hydrogen atom or a substituent, substituent $R_1$, substituent $R_2$, and substituent $R_3$ being each independently an alkyl group having 1 to 20 carbon atoms, a cycloalkyl group having 3 to 20 ring carbon atoms, an aryl group having 6 to 18 ring carbon atoms, or a heteroaryl group having 5 to 18 ring atoms;

$L_1$ is a single bond, an arylene group having 6 to 18 ring carbon atoms, or a heteroarylene group having 5 to 18 ring atoms;

$L_2$ is a single bond, an arylene group having 6 to 18 ring carbon atoms, a heteroarylene group having 5 to 18 ring atoms, a divalent linking group containing a nitrogen atom, a divalent linking group containing an oxygen atom, a divalent linking group containing a silicon atom, a divalent linking group containing a phosphorus atom, or a divalent linking group containing a sulfur atom;

Y is an oxygen atom, a sulfur atom, or $-N(-L_3-R_5)-$;

$L_3$ is a single bond, an arylene group having 6 to 18 ring carbon atoms, or a heteroarylene group having 5 to 18 ring atoms; and $R_5$ is a hydrogen atom or a substituent, substituent $R_5$ being an alkyl group having 1 to 20 carbon atoms, a cycloalkyl group having 3 to 20 ring carbon atoms, an aryl group having 6 to 18 ring carbon atoms, or a heteroaryl group having 5 to 18 ring atoms.

An example of the divalent linking group containing a nitrogen atom is a group represented by a formula (31B) below.

An example of the divalent linking group containing an oxygen atom is a group represented by a formula (31C) below.

An example of the divalent linking group containing a silicon atom is a group represented by a formula (31D) below.

Examples of the divalent linking group containing a phosphorus atom are groups represented by formulae (31E) and (31F) below.

Examples of the divalent linking group containing a sulfur atom are groups represented by formulae (31H) and (31G) below.

[Formula 32]

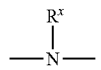  (31B)

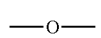  (31C)

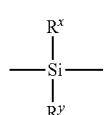  (31D)

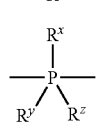  (31E)

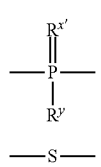  (31F)

—S—  (31G)

  (31H)

In the formulae (31B) to (31H), $R^x$, $R^y$, and $R^z$ are each independently a hydrogen atom or a substituent, substituent $R^x$, substituent $R^y$, and substituent $R^z$ being each independently a substituted or unsubstituted alkyl group having 1 to 20 carbon atoms, a substituted or unsubstituted cycloalkyl group having 3 to 20 ring carbon atoms, a substituted or unsubstituted cycloalkoxy group having 3 to 20 ring carbon atoms, a substituted or unsubstituted alkoxy group having 1 to 20 carbon atoms, a substituted or unsubstituted aryl group having 6 to 18 ring carbon atoms, a substituted or unsubstituted heteroaryl group having 5 to 18 ring atoms, a substituted or unsubstituted aryloxy group having 6 to 18 ring carbon atoms, a substituted or unsubstituted amino group having 0 to 20 carbon atoms, a substituted or unsubstituted silyl group having 0 to 30 carbon atoms, a fluoro group, or a cyano group. $R^{x'}$ in the formula (31F) is oxygen.

$L_2$ is preferably a group represented by the formula (31C), the formula (31G), or the formula (31F).

In the compound represented by the formula (31) or the formula (32), at least one $R_2$ is preferably a substituted or unsubstituted carbazolyl group, a substituted or unsubstituted dibenzofuranyl group, or a substituted or unsubstituted dibenzothiophenyl group.

In the formula (31) and the formula (32), $G_{14}$ is preferably a nitrogen atom.

In the formula (31) and the formula (32), it is preferable that Y is $-N(-L_3-R_5)-$ and $R_5$ is a heteroaryl group represented by a formula (31A) below.

[Formula 33]

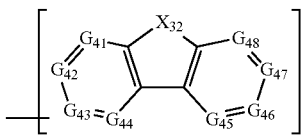  (31A)

In the formula (31A):
one of $G_{41}$ to $G_{48}$ is a carbon atom bonded to $L_3$ and the rest of $G_{41}$ to $G_{48}$ are each a nitrogen atom or $C(R_6)$;

$R_6$ is a hydrogen atom or a substituent, substituent $R_6$ being a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aryl group having 6 to 18 ring carbon atoms, a substituted or unsubstituted heteroaryl group having 5 to 18 ring atoms, a substituted or unsubstituted aryloxy group having 6 to 18 ring carbon atoms, a substituted or unsubstituted amino group having 0 to 20 carbon atoms, a substituted or unsubstituted silyl group having 0 to 30 carbon atoms, a fluoro group, or a cyano group;

a plurality of $R_6$ are mutually the same or different;

when $R_6$ are substituted, substituents are each independently at least one substituent selected from the group consisting of an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aryl group having 6 to 18 ring carbon atoms, a heteroaryl group having 5 to 18 ring atoms, an aryloxy group having 6 to 18 ring carbon atoms, an amino group having 0 to 20 carbon atoms, a silyl group having 0 to 20 carbon atoms, a fluoro group, and a cyano group;

$X_{32}$ is an oxygen atom, a sulfur atom, or —N($R_7$)—;

$R_7$ is a hydrogen atom or a substituent, substituent $R_7$ being an alkyl group having 1 to 20 carbon atoms, a cycloalkyl group having 3 to 20 ring carbon atoms, an aryl group having 6 to 18 ring carbon atoms, or a heteroaryl group having 5 to 18 ring atoms.

In the formula (31) and the formula (32), Y is preferably an oxygen atom or a sulfur atom.

In the formula (31) and the formula (32), $L_1$ is preferably a single bond, an arylene group having 6 to 18 ring carbon atoms, or a heteroarylene group having 5 to 18 ring atoms.

In the formula (31) and the formula (32), $L_1$ is preferably an arylene group having 6 to 18 ring carbon atoms or a heteroarylene group having 5 to 18 ring atoms.

For $L_1$ in the formula (31) or formula (32), the heteroarylene group having 5 to 18 ring atoms is preferably neither a divalent group of dibenzofuran nor a divalent group of dibenzothiophene.

In the formula (31) and the formula (32), $L_1$ is preferably a phenylene group.

In the formula (31) and the formula (32), $L_2$ is an alkylene group having 1 to 20 carbon atoms, a cycloalkylene group having 3 to 20 ring carbon atoms, a divalent linking group containing an oxygen atom, a divalent linking group containing a silicon atom, a divalent linking group containing a phosphorus atom, or a divalent linking group containing a sulfur atom.

In the formula (31) and the formula (32), $L_2$ is also preferably a single bond.

In the formula (31) and the formula (32), when Y is —N(-$L_3$-$R_5$)— and $R_5$ is a heteroaryl group represented by the formula (31A), at least one of $G_{31}$ to $G_{38}$ and $G_{41}$ to $G_{48}$ is preferably a nitrogen atom.

In the exemplary embodiment, the third compound is also preferably represented by a formula (300) below.

[Formula 34]

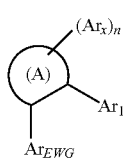

(300)

In the formula (300):

$Ar_1$ is a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, a carboxy group, and groups represented by formulae (12a) to (12j) below;

$Ar_{EWG}$ is a cyano group, a substituted or unsubstituted heteroaryl group having 5 to 30 ring atoms that comprises one or more nitrogen atoms in a ring, or an aryl group having 6 to 30 ring carbon atoms that is substituted with one or more cyano groups;

$Ar_X$ are each independently a hydrogen atom or a substituent, substituent $Ar_X$ being a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, a carboxy group, and groups represented by formulae (12a) to (12j) below;

n is an integer of 0 to 5;

when n is 2 or more, a plurality of $Ar_X$ may be mutually the same or different;

a ring (A) is a five-membered ring, a six-membered ring, or a seven-membered ring; and at least one of $Ar_1$ or $Ar_X$ is a group selected from groups represented by the formulae (12a) to (12j) below.

[Formula 35]

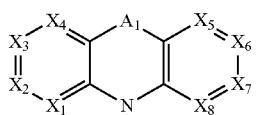

(12a)

[Formula 36]

(12b)

[Formula 37]

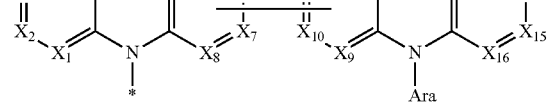

(12c)

[Formula 38]

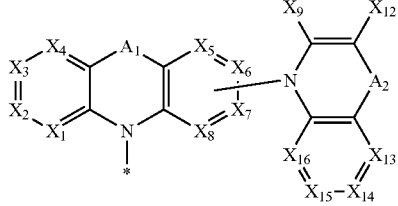

(12d)

[Formula 39]

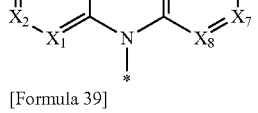

-continued (12e)
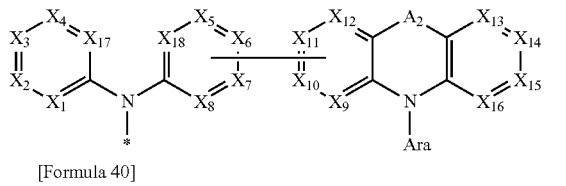
[Formula 40]

(12f)
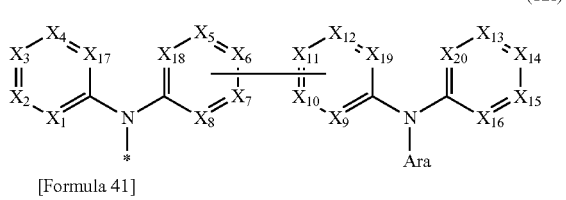
[Formula 41]

(12g)
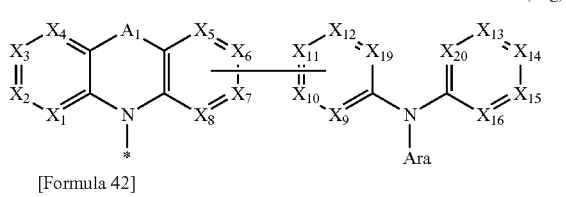
[Formula 42]

(12h)
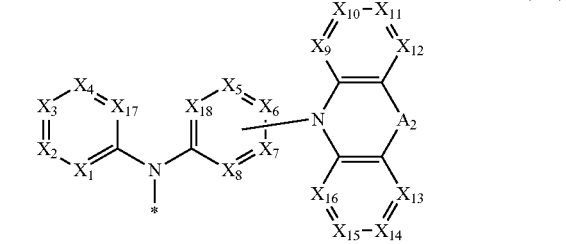
[Formula 43]

(12i)
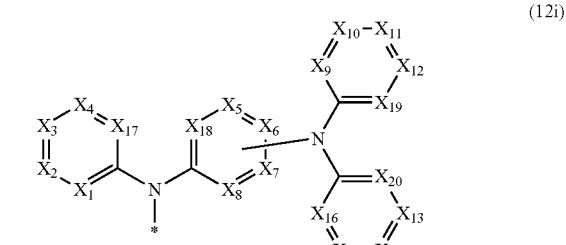
[Formula 44]

(12j)
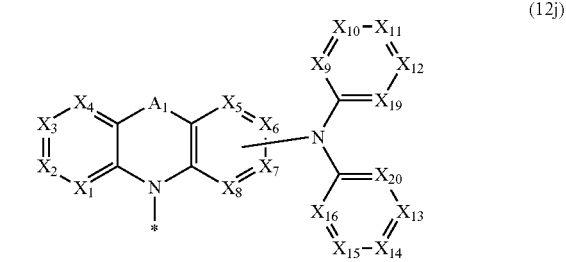

In the formulae (12a) to (12j):

$X_1$ to $X_{20}$ are each independently N or C—$R_{300}$ such that: in the formula (12b), one of $X_5$ to $X_8$ is a carbon atom bonded to one of $X_9$ to $X_{12}$ and the one of $X_9$ to $X_{12}$ is a carbon atom boned to the one of $X_5$ to $X_8$; in the formula (12c), one of $X_5$ to $X_8$ is a carbon atom bonded to a nitrogen atom in a six-membered ring of a fused ring containing $X_9$ to $X_{12}$, $X_{13}$ to $X_{16}$, and $A_2$; in the formula (12e), one of $X_5$ to $X_8$ and $X_{18}$ is a carbon atom bonded to one of $X_9$ to $X_{12}$ and the one of $X_9$ to $X_{12}$ is a carbon atom bonded to the one of $X_5$ to $X_8$ and $X_{18}$; in the formula (12f), one of $X_5$ to $X_8$ and $X_{18}$ is a carbon atom bonded to one of $X_9$ to $X_{12}$ and $X_{19}$ and the one of $X_9$ to $X_{12}$ and $X_{19}$ is a carbon atom bonded to the one of $X_5$ to $X_8$ and $X_{18}$; in the formula (12g), one of $X_5$ to $X_8$ is a carbon atom bonded to one of $X_9$ to $X_{12}$ and $X_{19}$ and the one of $X_9$ to $X_{12}$ and $X_{19}$ is a carbon atom bonded to the one of $X_5$ to $X_8$; in the formula (12h), one of $X_5$ to $X_8$ and $X_{18}$ is a carbon atom bonded to a nitrogen atom in a six-membered ring of a fused ring containing $X_9$ to $X_{12}$, $X_{13}$ to $X_{16}$, and $A_2$; in the formula (12i), one of $X_5$ to $X_8$ and $X_{18}$ is a carbon atom bonded to a nitrogen atom that links a ring containing $X_9$ to $X_{12}$ and $X_{19}$ and a ring containing $X_{13}$ to $X_{16}$ and $X_{20}$; and in the formula (12j), one of $X_5$ to $X_8$ is a carbon atom bonded to a nitrogen atom that links a ring containing $X_9$ to $X_{12}$ and $X_{19}$ and a ring containing $X_{13}$ to $X_{16}$ and $X_{20}$;

$R_{300}$ are each independently a hydrogen atom or a substituent, substituent $R_{300}$ being a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group;

a plurality of substituent $R_{300}$ are mutually the same or different;

the plurality of substituent $R_{300}$ are directly bonded to each other to form a ring, bonded to form a ring via a hetero atom, or not bonded;

$A_1$ and $A_2$ are each independently a single bond, O, S, C($R_{301}$)($R_{302}$), $S_i$($R_{303}$)($R_{304}$), C(=O), S(=O), $SO_2$, or N($R_{305}$);

$R_{301}$ to $R_{305}$ are each independently a hydrogen atom or a substituent, substituent $R_{301}$ to $R_{305}$ being each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group; and Ara is a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, and a substituted silyl group.

The aryl group having 6 to 30 ring carbon atoms that is substituted with one or more cyano groups may have another substituent in addition to the cyano group(s).

In the exemplary embodiment, the third compound is also preferably represented by a formula (301) below.

[Formula 45]

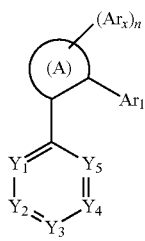

(301)

In the formula (301):
Y$_1$ to Y$_5$ are each independently N, C—CN, or C—R$_{310}$;
at least one of Y$_1$ to Y$_5$ is N or C—CN;
R$_{310}$ are each independently a hydrogen atom or a substituent, substituent R$_{310}$ being a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group;
Ar$_1$ is a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, a carboxy group, and groups represented by the formulae (12a) to (12c);
Ar$_X$ are each independently a hydrogen atom or a substituent, substituent Ar$_X$ being a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, a carboxy group, and groups represented by the formulae (12a) to (12c);
n is an integer of 0 to 5;
when n is 2 or more, a plurality of Ar$_X$ are mutually the same or different;
a ring (A) is a five-membered ring, a six-membered ring, or a seven-membered ring; and at least one of Ar$_1$ or Ar$_X$ is a group selected from groups represented by the formulae (12a) to (12c).

In the formula (301), at least one of Y$_1$, Y$_3$, or Y$_5$ is preferably N.

In the formula (301), Y$_1$, Y$_3$, and Y$_5$ are preferably each N while Y$_2$ and Y$_4$ are each C—R$_{310}$.

In the exemplary embodiment, the third compound is also preferably represented by a formula (302) below.

[Formula 46]

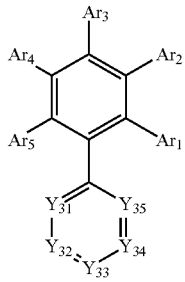

(302)

In the formula (302):
Y$_{31}$ to Y$_{35}$ are each independently N, C—CN, or C—R$_{310}$;
at least one of Y$_{31}$ to Y$_{35}$ is N or C—CN;
R$_{310}$ are each independently a hydrogen atom or a substituent, substituent R$_{310}$ being a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, and a carboxy group;
Ar$_1$ is a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, a carboxy group, and groups represented by the formulae (12a) to (12c);
Ar$_2$ to Ar$_5$ are each independently a hydrogen atom or a substituent, substituent Ar$_2$ to Ar$_5$ being each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted phosphoryl group, a substituted silyl group, a cyano group, a nitro group, a carboxy group, and groups represented by the formulae (12a) to (12c);

at least one of $Ar_1$ to $Ar_5$ is a group selected from groups represented by the formulae (12a) to (12c).

In the exemplary embodiment, the third compound is also preferably a compound represented by a formula (303), formula (304), or formula (305) below.

[Formula 47]

(303)

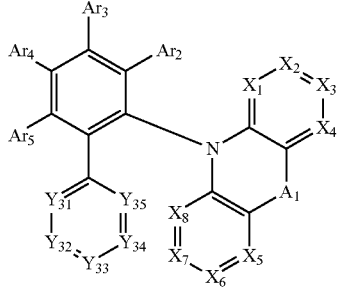

[Formula 48]

(304)

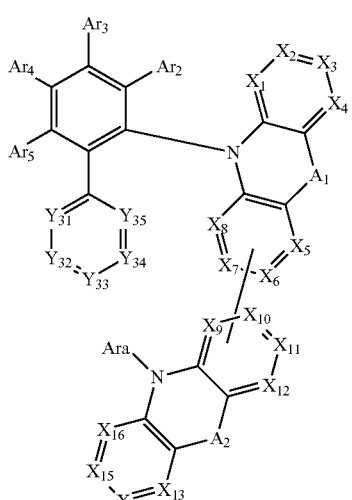

(305)

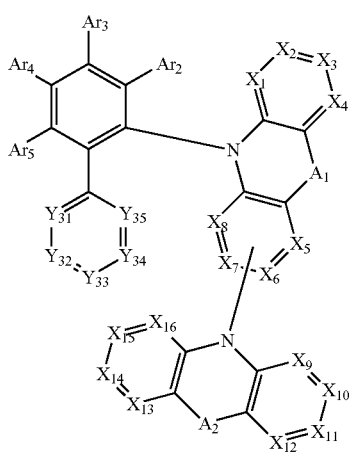

In the formulae (303) to (305), $Y_{31}$ to $Y_{35}$, $Ar_2$ to $Ar_5$, $X_1$ to $X_{16}$, $A_1$, $A_2$, and Ara represent the same as the above-described $Y_{31}$ to $Y_{35}$, $Ar_2$ to $Ar_5$, $X_1$ to $X_{16}$, $A_1$, $A_2$, and Ara, respectively.

In the exemplary embodiment, the third compound is also preferably a compound represented by a formula (306), formula (307), or formula (308) below.

[Formula 49]

(306)

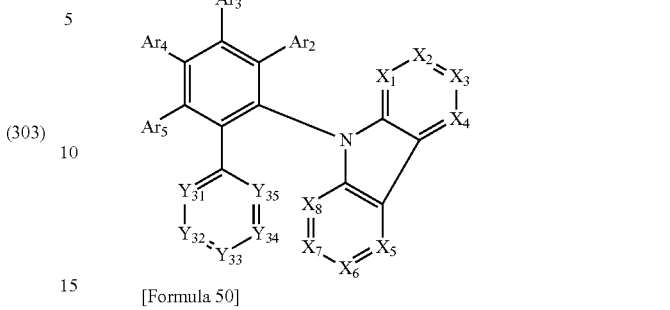

[Formula 50]

(307)

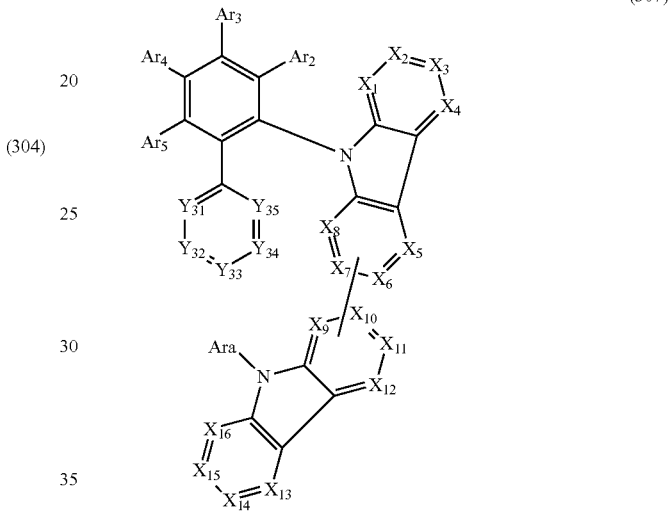

(308)

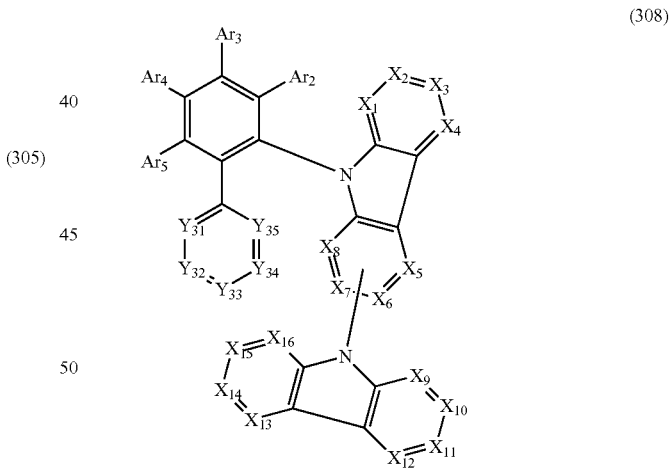

In the formulae (306) to (308), $Y_{31}$ to $Y_{35}$, $Ar_2$ to $Ar_5$, $X_1$ to $X_{16}$, and Ara represent the same as the above-described $Y_{31}$ to $Y_{35}$, $Ar_2$ to $Ar_5$, $X_1$ to $X_{16}$, and Ara, respectively.

It is also preferable that at least one of $Y_{31}$, $Y_{33}$, or $Y_{35}$ is N.

It is also preferable that $Y_{31}$, $Y_{33}$, and $Y_{35}$ are each N and $Y_{32}$ and $Y_{34}$ are each C—$R_{310}$.

It is also preferable that $Y_{31}$ and $Y_{33}$ are each N and $Y_{32}$, $Y_{34}$, and $Y_{35}$ are each C—$R_{310}$.

It is also preferable that $Y_{31}$ and $Y_{35}$ are each N and $Y_{32}$, $Y_{33}$ and $Y_{34}$ are each C—$R_{310}$.

In the exemplary embodiment, the third compound is also preferably a compound represented by a formula (320) below.

[Formula 51]

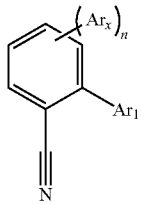

(320)

In the formula (320), An, $Ar_X$, and n represent the same as $Ar_1$, $Ar_X$, and n in the formula (300), respectively.

In the formula (320), An and $Ar_X$ are preferably each a group represented by the formula (12a).

In the formula (320), n is preferably 3.

In the exemplary embodiment, the third compound is also preferably a compound represented by a formula (321) below.

[Formula 52]

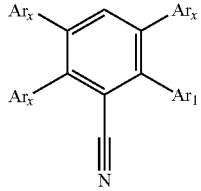

(321)

In the formula (321), An and $Ar_X$ represent the same as $Ar_1$ and $Ar_X$ in the formula (300), respectively.

In the formula (320) and formula (321), An and $Ar_X$ are preferably each a group represented by the formula (12a).

In the formula (321), An and $Ar_X$ are preferably each a group represented by the formula (12a), $A_1$ in the formula (12a) being a single bond.

The third compound of the exemplary embodiment is also preferably a fluoranthene derivative.

Specific examples of the third compound of the exemplary embodiment are shown below. It should be noted that the third compound according to the invention is not limited to these examples.

[Formula 53]

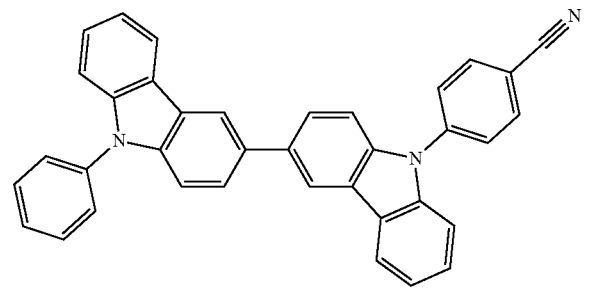

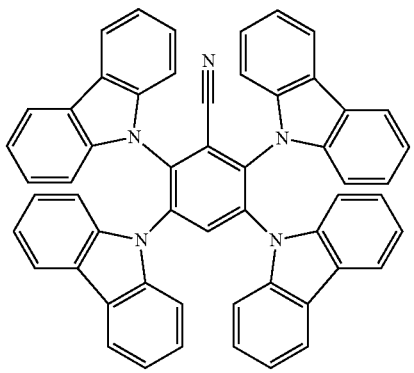

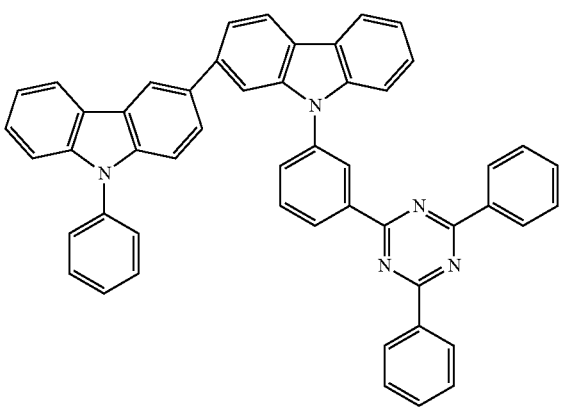

[Formula 54]

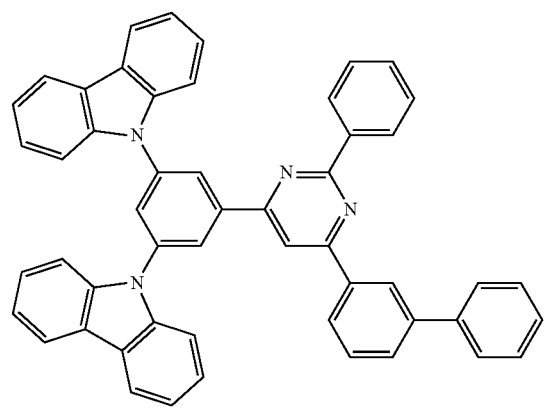

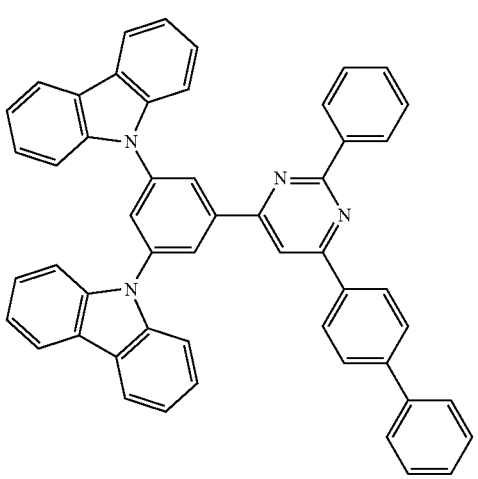

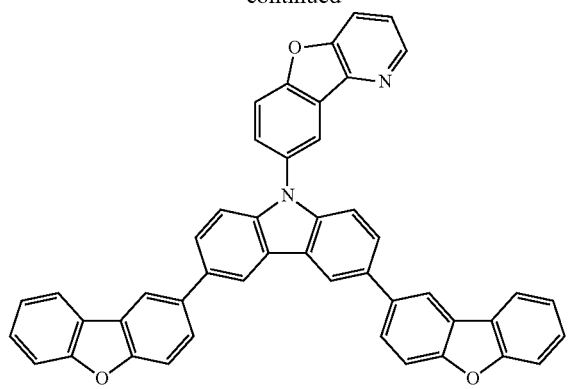

[Formula 55]

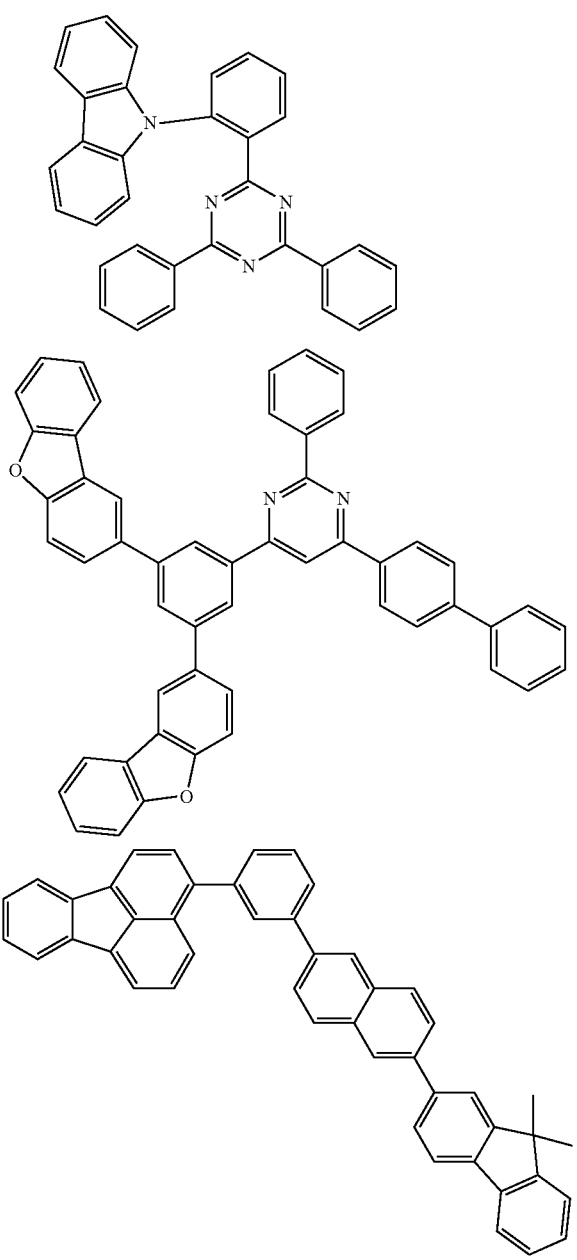

[Formula 56]

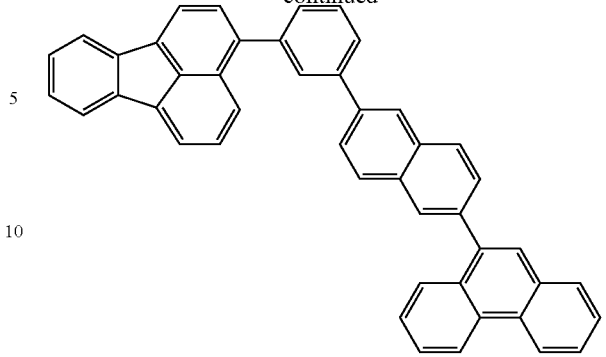

When driven, the organic EL device of the exemplary embodiment preferably emits light with a peak that falls within a wavelength range of 550 nm or less. In other words, a main peak wavelength of the light emitted from the organic EL device preferably falls within a range of 550 nm or less. When the organic EL device of the exemplary embodiment is driven to emit light, the second compound in the emitting layer preferably mainly emits light. A wavelength range of the light emitted from the organic EL device of the exemplary embodiment is preferably in a range from 430 nm to 550 nm, more preferably from 430 nm to 480 nm, particularly preferably from 445 nm to 480 nm.

An example of organic EL device of the exemplary embodiment is an organic EL device configured to emit blue fluorescence or green fluorescence.

The organic EL device of the exemplary embodiment is configured to emit delayed fluorescence. The organic EL device of the exemplary embodiment is preferably configured to emit delayed fluorescence, since a reduction in the luminous efficiency of the organic EL device is supposed to be inhibited.

Relationship Between Triplet Energy and Energy Gap at 77[K]

Description will be made on a relationship between triplet energy and energy gap at 77[K]. In the exemplary embodiment, the energy gap at 77[K] is different from a triplet energy as typically defined in some aspects.

The triplet energy is measured as follows. First, a sample is prepared by encapsulating in a quartz glass tube a target compound dissolved in an appropriate solvent. A phosphorescence spectrum (ordinate axis: phosphorescent luminous intensity, abscissa axis: wavelength) of the sample is measured at a low temperature (77[K]). A tangent is drawn to a rise of the phosphorescence spectrum on the short-wavelength side. The triplet energy is calculated from a wavelength value at an intersection between the tangent and the abscissa axis using a predetermined conversion equation.

The delayed fluorescent compound used in the exemplary embodiment is preferably a compound with a small ΔST. At a small ΔST, inter-system crossing and reversed inter-system crossing are likely to occur even at a low temperature (77[K]), allowing a singlet state and a triplet state to coexist. The spectrum being measured in the same manner as described above thus contains luminescence from the singlet state and luminescence from the triplet state, which are unlikely to be distinguished from each other. However, a value of the triplet energy is supposed to be basically dominant.

Accordingly, in the exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. A measurement sample is prepared by putting in a quartz cell a target compound dissolved in EPA (diethylether:isopentane:ethanol=5:5:2 in volume ratio) such that the concentration reaches 10 μmol/L. A phosphorescence spectrum (ordinate axis: phosphorescent luminous intensity, abscissa axis: wavelength) of the measurement sample is measured at a low temperature (77[K]). A tangent is drawn to a rise of the phosphorescence spectrum on the short-wavelength side. An energy amount calculated from a wavelength value $\lambda_{edge}$ [nm] at an intersection between the tangent and the abscissa axis using a conversion equation (F1) below is referred to as the energy gap $T_{77K}$ at 77[K].

$$T_{77K}[eV]=1239.85/\lambda_{edge} \quad \text{Conversion Equation:}$$

The tangent to the rise of the phosphorescence spectrum on the short-wavelength side is drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent is increased as the curve rises (i.e., a value of the ordinate axis is increased). A tangent drawn at a point with the maximum inclination (i.e., a tangent at an inflection point) is defined as the tangent to the rise of the phosphorescence spectrum on the short-wavelength side.

A maximum with a peak intensity of 15% or less of the maximum peak intensity of the spectrum is not included in the above-mentioned maximum closest to the short-wavelength side of the spectrum. The tangent drawn at a point with the maximum spectral value being the closest to the short-wavelength side and having the maximum inclination is defined as the tangent to the rise of the phosphorescence spectrum on the short-wavelength side.

For phosphorescence measurement, a spectrophotofluorometer body F-4500 (manufactured by Hitachi High-Technologies Corporation) is usable. It should be noted that the measurement may be performed not by the above measuring device but by a combination of a cooling unit, a low temperature container, an excitation light source and a light-receiving unit.

Singlet Energy $S_1$

A measurement method of the singlet energy $S_1$ using a solution may be performed as follows.

A 10 μmol/L toluene solution of a target compound is prepared and put in a quartz cell. An absorption spectrum (ordinate axis: luminous intensity, abscissa axis: wavelength) of this sample is measured at a normal temperature (300K). A tangent is drawn to a fall of the absorption spectrum on the long-wavelength side and a wavelength value $\lambda_{edge}$ [nm] at an intersection between the tangent and the abscissa axis is assigned to a conversion equation (F2) below to calculate the singlet energy $S_1$.

$$S_1[eV]=1239.85/\lambda_{edge} \quad \text{Conversion Equation (F2):}$$

An example of the absorption spectrum measuring device is, but not limited to, a spectrophotometer manufactured by Hitachi, Ltd. (device name: U3310).

The tangent to the fall of the absorption spectrum on the long-wavelength side is drawn as follows. While moving on a curve of the absorption spectrum in a long-wavelength direction from the maximum spectral value closest to the long-wavelength side among the maximum spectral values, a tangent is checked at each point on the curve. An inclination of the tangent is decreased and increased in a repeated manner as the curve falls (i.e., a value of the ordinate axis is decreased). A tangent drawn at a point with the minimum inclination closest to the long-wavelength side (except when absorbance is 0.1 or less) is defined as the tangent to the fall of the absorption spectrum on the long-wavelength side.

A maximum with an absorbance of 0.2 or less is not included in the above-mentioned maximum closest to the long-wavelength side.

Concentrations of Compounds in Emitting Layer

An upper limit of the total of the respective concentrations of the first, second and third compounds in the emitting layer is 100 mass %. It should be noted that the emitting layer of the exemplary embodiment may further contain another material in addition to the first, second and third compounds.

For instance, the concentration of each of the first, second and third compounds in the emitting layer is preferably in the following range.

The concentration of the third compound in the emitting layer is preferably less than 50 mass %, more preferably 30 mass % or less. The concentration of the third compound is preferably 5 mass % or more, more preferably 10 mass % or more. The concentration of the third compound is particularly preferably in a range from 10 mass % to 30 mass %.

The concentration of the second compound in the emitting layer is preferably in a range from 0.01 mass % to 10 mass %, more preferably from 0.01 mass % to 5 mass %, further preferably from 0.01 mass % to 1 mass %.

In addition to the second compound and the third compound, the emitting layer also preferably contains the balance substantially consisting of the first compound. The expression "substantially consisting of the first compound" means that any compound other than the first compound is not deliberately contained as the balance in the emitting layer in addition to the second compound and the third corn pound.

Film Thickness of Emitting Layer

A film thickness of the emitting layer 5 is preferably in a range from 5 nm to 50 nm, more preferably from 7 nm to 50 nm, further preferably from 10 nm to 50 nm. With the film thickness of the emitting layer 5 being 5 nm or more, the emitting layer 5 can be easily formed and chromaticity can be easily adjusted. With the film thickness of the emitting layer 5 being 50 nm or less, an increase in the drive voltage can be inhibited.

TADF Mechanism

Figure 4:
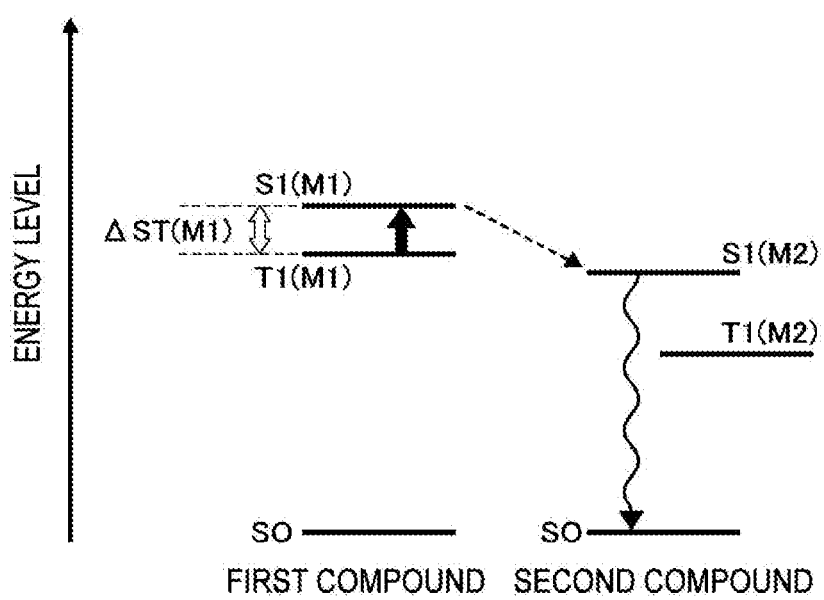
FIG. 4 schematically shows a relationship between respective energy levels of a first compound and a second compound in an emitting layer and energy transfer.

FIG. 4 shows an example of a relationship between respective energy levels of the first and second compounds in the emitting layer. In FIG. 4, S0 represents a ground state. S1(M1) represents a lowest singlet state of the first compound. T1(M1) represents a lowest triplet state of the first compound. S1(M2) represents a lowest singlet state of the second compound. T1(M2) represents a lowest triplet state of the second compound. It should be noted that ΔST(M1) represents a difference between a singlet energy of the first compound and an energy gap at 77[K] of the first compound in FIG. 4.

A dashed arrow directed from S1(M1) to S1(M2) in FIG. 4 represents Förster energy transfer from the lowest singlet state of the first compound to the second compound.

As shown in FIG. 4, when a compound having a small ΔST(M1) is used as the first compound, reversed intersystem crossing from the lowest triplet state T1(M1) to the lowest singlet state S1(M1) can be caused by a heat energy. Consequently, Förster energy transfer from the lowest singlet state S1(M1) of the first compound to the second compound is caused to generate the lowest singlet state S1(M2). As a result, fluorescence from the lowest singlet state S1(M2) of the second compound can be observed. It is speculated that the internal quantum efficiency can be theoretically raised up to 100% also by using the delayed fluorescence based on the TADF mechanism.

Delayed Fluorescence Ratio

In the organic EL device of the exemplary embodiment, a delayed fluorescence ratio preferably exceeds 37.5%. The delayed fluorescence ratio corresponds to a ratio of a luminous intensity derived from delayed fluorescence to the total luminous intensity. More specifically, the delayed fluorescence ratio is a ratio of a luminous intensity derived from delayed fluorescence, the ratio of the luminous intensity derived from delayed fluorescence being represented as a luminous intensity $1/A^2$ at time (t=0) when a pulse voltage is removed from a transient EL waveform data having been measured by a transient EL method and fitted with a numerical expression (4) below.

Numerical Expression 1

$$\frac{1}{\sqrt{I}} \propto A + \gamma \cdot t \quad (4)$$

In the numerical expression (4), l is the luminous intensity derived from delayed fluorescence and A is a constant.

The delayed fluorescence ratio may be measured by the transient EL method. According to the transient EL method, a decay behavior (transient property) is measured after the removal of a pulse voltage applied to a device. The intensity of EL emission is divided into a luminescence component from singlet excitons generated by the first recombination and a luminescence component from singlet excitons generated through transition to triplet excitons. The singlet excitons generated by the first recombination, which has a considerably short lifetime in a nanosecond order, decays immediately upon the removal of the pulse voltage.

In contrast, delayed fluorescence, which is luminescence from the singlet excitons generated through transition to long-life triplet excitons, gradually decays. In other words, the luminescence from the singlet excitons generated by the first recombination is considerably different in time from the luminescence from the singlet excitons generated through transition to the triplet excitons, so that the luminous intensity derived from delayed fluorescence can be determined. Specifically, the luminous intensity may be determined as follows.

Figure 5:
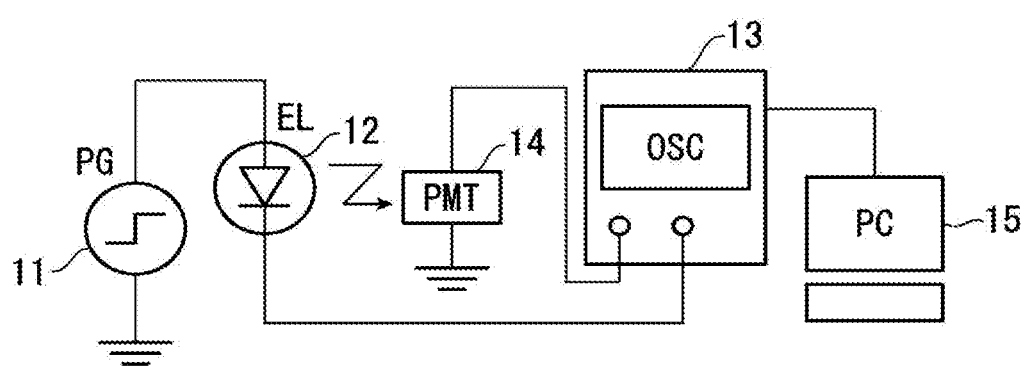
FIG. 5 shows a measurement system of a transient EL waveform.

The transient EL waveform is measured as follows (see FIG. 5). A pulse voltage waveform outputted from a voltage pulse generator (PG) 11 is applied to an organic EL device (EL) 12. A waveform of the applied voltage is loaded to an oscilloscope (OSC) 13. In response to the pulse voltage applied to the organic EL device 12, pulse emission of the organic EL device 12 is caused. The emission is loaded to the oscilloscope (OSC) 13 through a photomultiplier (PMT) 14. The voltage waveform and the pulse emission are synchronized and loaded in a personal computer (PC) 15.

The ratio of the luminous intensity derived from delayed fluorescence is defined based on analysis of the transient EL waveform as follows. It should be noted that a formula for calculating a TTF ratio described in International Publication No. WO2010/134352 may be used for calculation of the ratio of the luminous intensity derived from delayed fluorescence.

It is considered that a delayed fluorescence component defined herein includes thermally activated delayed fluorescence (TADF mechanism) described herein in addition to the luminescence component derived from TTF. For this reason, a ratio of the delayed fluorescence component calculated by the numerical expression (4) is referred to as a delayed fluorescence ratio, not as a TTF ratio.

In the numerical expression (4), l is the luminous intensity derived from delayed fluorescence and A is a constant. The measured transient EL waveform data is fitted with the numerical expression (4) to obtain the constant A. Here, a luminous intensity $1/A^2$ at the time t=0 when pulse voltage is removed is defined as the ratio of the luminous intensity derived from delayed fluorescence.

A method of measuring the ratio of the luminous intensity derived from delayed fluorescence is explained with reference to examples shown in FIGS. 6A and 6B. A graph of FIG. 6A shows a measurement example of a transient EL waveform obtained by applying a predetermined pulse voltage to the organic EL device and then removing the pulse voltage, in particular, showing time-varying luminous intensities of the organic EL device.

Figure 6A:
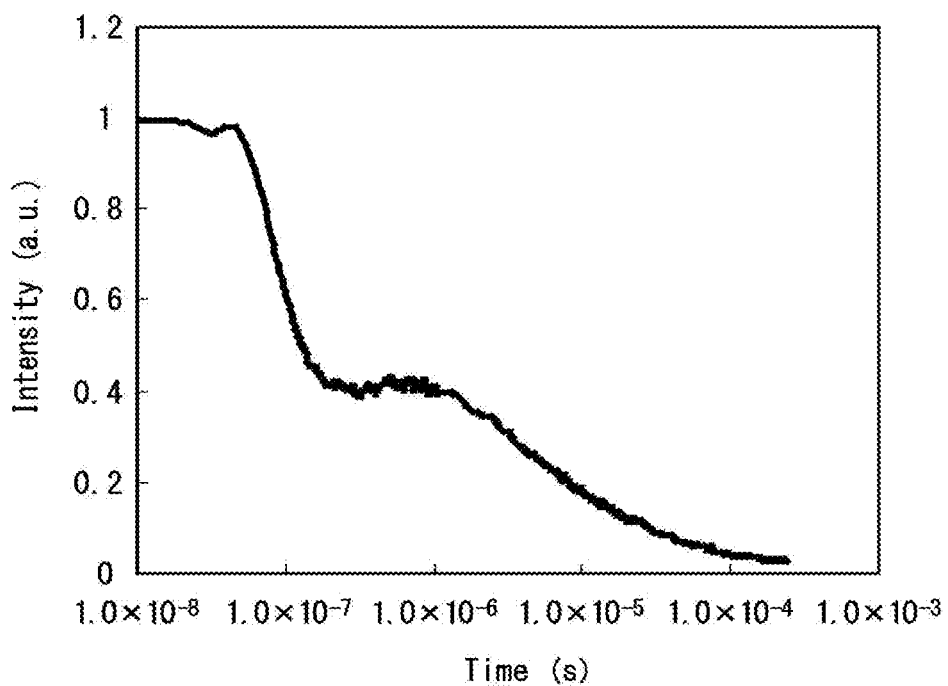
FIG. 6A is a graph showing a measurement method of a ratio of a luminous intensity derived from delayed fluorescence, in particular, showing a variation in a luminous intensity of an organic EL device with time.

The pulse voltage was removed at the time of approximately $3 \times 10^{-8}$ seconds in the graph of FIG. 6 (A). In the graph of FIG. 6A, a luminance obtained at the voltage removal is defined as 1.

After rapid reduction before the elapse of approximately $2 \times 10^{-7}$ seconds after the voltage removal, a gradual reduction component appears.

Figure 6B:
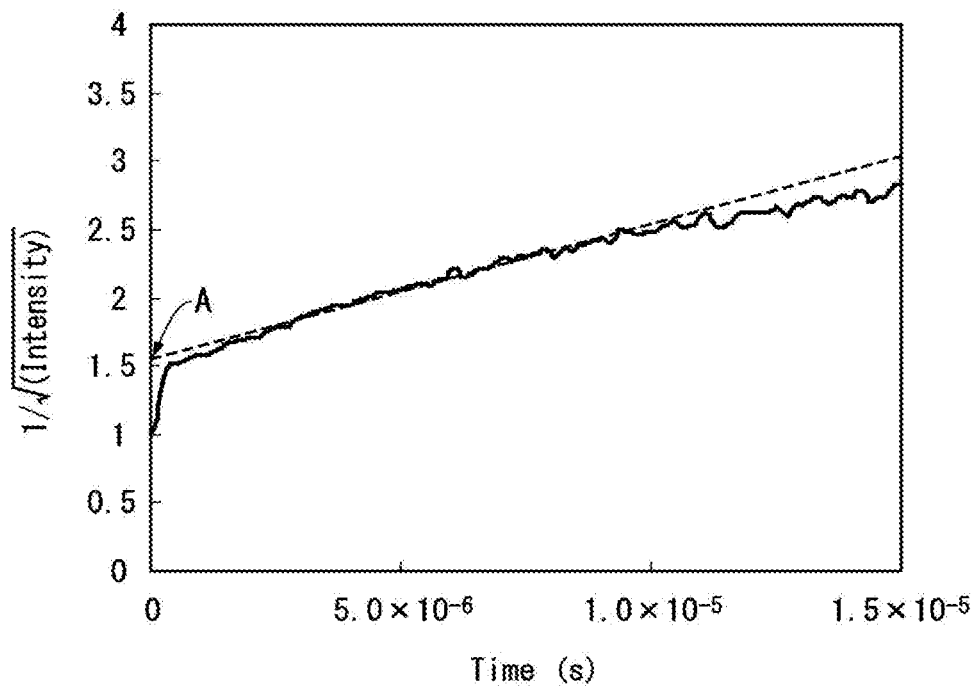
FIG. 6B is a graph showing the measurement method of a ratio of a luminous intensity derived from delayed fluorescence, in particular, showing a variation in an inverse square root of the luminous intensity with time.

In the graph of FIG. 6B, the voltage removal time is a starting point and the inverse square root of luminous intensity before the elapse of $1.5 \times 10^{-5}$ seconds after voltage removal is plotted. Fitting is conducted as follows.

The luminous intensity is preferably fitted in a linear line by the method of least squares. In this case, the luminous intensity before the elapse of $10^{-5}$ seconds is preferably fitted.

A value at an intersection A of the ordinate axis and the linear line extended to the starting point is 1.55. Accordingly, the ratio of the luminous intensity derived from the delayed fluorescence obtained from the transient EL waveform is $1/(1.55)^2 = 0.41$. In other words, 41% of the luminous intensity is determined to be derived from the delayed fluorescence. Thus, the delayed fluorescence ratio is 41%, which exceeds 37.5%, i.e., the supposed theoretical upper-limit of the TTF ratio.

The luminous intensity derived from the delayed fluorescence obtained from the transient EL waveform is variable depending on measurement temperatures. Such a phenomenon is considered to be inherent mostly in fluorescent emission by the TADF mechanism Residual Strength Ratio in 1 µs For the organic EL device of the exemplary embodiment, a residual strength ratio determined after the elapse of 1 µs from the voltage removal for the transient EL measurement is preferably larger than 36.0%, more preferably 38.0% or larger.

A method for relatively measuring an amount of delayed fluorescence is exemplified by a method for measuring a residual strength in 1 µs. The residual strength in 1 µs is defined as a ratio of a luminous intensity after the elapse of 1 µs after removal of a pulse voltage measured by the transient EL method to a luminous intensity at the time of the removal of the pulse voltage. The relative amount of delayed fluorescence can be estimated based on reduction behavior of EL emission after the removal of the pulse voltage measured by the transient EL method. The residual strength ratio in 1 μs can be obtained by reading luminous intensity at the time of 1.0 μs in the graph of FIG. 6A.

Substrate

A substrate 2 is used as a support for the organic EL device 1. For instance, glass, quartz and plastics are usable for the substrate 2. A flexible substrate is also usable. The flexible substrate is a bendable substrate, which is exemplified by a plastic substrate. Examples of a material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vacuum deposition film is also usable.

Anode

Preferable examples of a material for the anode 3 formed on the substrate 2 include metal, alloy, an electroconductive compound, and a mixture thereof, which have a large work function (specifically, 4.0 eV or more). Specific examples of the material for the anode include indium tin oxide (ITO), indium tin oxide containing silicon or silicon oxide, indium zinc oxide, tungsten oxide, indium oxide containing zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of these metal materials (e.g., titanium nitride) are usable.

The above materials are typically deposited as a film by sputtering. For instance, indium zinc oxide can be deposited as a film by sputtering using a target that is obtained by adding zinc oxide in a range from 1 mass % to 10 mass % to indium oxide. Moreover, for instance, indium oxide containing tungsten oxide and zinc oxide can be deposited as a film by sputtering using a target that is obtained by adding tungsten oxide in a range from 0.5 mass % to 5 mass % and zinc oxide in a range from 0.1 mass % to 1 mass % to indium oxide. In addition, vacuum deposition, coating, ink jet printing and spin coating may be used for forming a film.

Among the organic layers formed on the anode 3, the hole injecting layer 6 in contact with the anode 3 is formed from a composite material that facilitates injection of holes irrespective of the work function of the anode 3. Accordingly, a material usable as an electrode material (e.g., metal, alloy, an electrically conductive compound, a mixture thereof, and elements belonging to Groups 1 and 2 of the periodic table of the elements) is usable as the material for the anode 3.

The elements belonging to Groups 1 and 2 of the periodic table of the elements, which are materials having a small work function, a rare earth metal, and alloy thereof are also usable as the material for the anode 3. The elements belonging to Group 1 of the periodic table of the elements are, for instance, alkali metal. The elements belonging to Group 2 of the periodic table of the elements are, for instance, alkaline earth metal. Examples of alkali metal are lithium (Li) and cesium (Cs). Examples of alkaline earth metal are magnesium (Mg), calcium (Ca), and strontium (Sr). Examples of the rare earth metal include europium (Eu) and ytterbium (Yb). Examples of the alloys containing these metals include MgAg and AlLi.

It should be noted that vacuum deposition and sputtering are usable for forming the anode 3 from the alkali metal, alkaline earth metal, and the alloy thereof. Further, for forming the anode from silver paste or the like, coating, ink jet printing and the like are usable.

Hole Injecting Layer

The hole injecting layer 6 is a layer containing a substance exhibiting a high hole-injecting capability. Examples of the substance exhibiting a high hole-injecting capability include molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

Moreover, examples of the substance exhibiting a high hole-injecting capability further include: an aromatic amine compound, which is a low molecular organic compound, such as 4,4',4''-tris(N, N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

Moreover, a polymer compound is also usable as the substance exhibiting a high hole-injecting capability. Examples of the polymer compound are an oligomer, dendrimer and polymer. Specific examples of the polymer compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). Furthermore, the examples of the polymer compound include a polymer compound added with an acid such as poly(3,4-ethylene dioxythiophene)/poly(styrene sulfonic acid) (PEDOT/PSS) and polyaniline/poly(styrene sulfonic acid) (PAni/PSS).

Hole Transporting Layer

The hole transporting layer 7 is a layer containing a substance exhibiting a high hole-transporting capability. For instance, an aromatic amine compound, carbazole derivative and anthracene derivative are usable for the hole transporting layer 7. Specific examples of the substance usable for the hole transporting layer 6 include an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ cm$^2$/(V·s) or more.

For the hole transporting layer 7, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A polymer compound such as poly(N-vinylcarbazole) (abbreviation: PVK) and poly(4-vinyltriphenylamine) (abbreviation: PVTPA) is also usable.

However, any substance exhibiting a hole-transporting capability higher than an electron transporting capability may be used in place of the above substances. A layer containing the substance exhibiting a high hole-transporting capability may be provided in the form of a single layer or a laminate of two or more layers of the above substance(s).

When two or more hole transporting layers are provided, one of the hole transporting layers containing a material having a larger energy gap is preferably provided closer to the emitting layer 5.

Electron Transporting Layer

The electron transporting layer 8 is a layer containing a substance exhibiting a high electron-transporting capability. As the electron transporting layer, 1) a metal complex such as an aluminum complex, beryllium complex and zinc complex, 2) a heteroaromatic compound such as an imidazole derivative, benzimidazole derivative, azine derivative, carbazole derivative, and phenanthroline derivative, and 3) a polymer compound are usable. Specifically, as a low molecular organic compound, a metal complex such as Alq, tris(4-methyl-8-quinolinolato)aluminum (abbreviation: Almq$_3$), bis(10-hydroxybenzo[h]quinolinato)beryllium (abbreviation: BeBq$_2$), BAlq, Znq, ZnPBO, and ZnBTZ are usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzooxazole-2-yl)stilbene (abbreviation: BzOs) is usable. In the exemplary embodiment, a benzimidazole compound is suitably usable. The above-described substances mostly have an electron mobility of $10^{-6}$ cm$^2$/(V·s) or more. However, any substance exhibiting an electron-transporting capability higher than a hole-transporting capability may be used for the electron transporting layer 8 in place of the above substances. The electron transporting layer 8 may be provided in the form of a single layer or a laminate of two or more layers of the above substance(s).

Moreover, a polymer compound is also usable for the electron transporting layer 8. Examples of the polymer compound include poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy).

Electron Injecting Layer

The electron injecting layer 9 is a layer containing a substance exhibiting a high electron-injecting capability. For the electron injecting layer 9, an alkali metal, alkaline earth metal and a compound thereof, such as lithium (Li), cesium (Cs), calcium (Ca), lithium fluoride (LiF), cesium fluoride (CsF), calcium fluoride (CaF$_2$), and lithium oxide (LiOx), are usable. In addition, the alkali metal, alkaline earth metal or the compound thereof may be added to the substance exhibiting an electron transporting capability in use. Specifically, for instance, a substance provided by adding magnesium (Mg) to Alq may be used. In this case, the electrons can be more efficiently injected from the cathode 4.

Alternatively, a composite material provided by mixing an organic compound with an electron donor may be used for the electron injecting layer 9. The composite material exhibits excellent electron injecting capability and electron transporting capability, since the electron donor generates electrons in the organic compound. In this case, the organic compound is preferably a material exhibiting an excellent transforming performance for the generated electrons. Specifically, for instance, the above-described substance for the electron transporting layer 8 (e.g., the metal complex and heteroaromatic compound) is usable. The electron donor may be any substance exhibiting an electron donating performance to the organic compound. Specifically, an alkali metal, alkaline earth metal and a rare earth metal are preferable, examples of which include lithium, cesium, magnesium, calcium, erbium and ytterbium. Moreover, an alkali metal oxide or alkaline earth metal oxide is preferably used as the electron donor, examples of which include lithium oxide, calcium oxide, and barium oxide. Further, Lewis base such as magnesium oxide is also usable. Furthermore, tetrathiafulvalene (abbreviation: TTF) is also usable.

Cathode

For instance, metal, alloy, an electrically conductive compound and a mixture thereof, which have a small work function (specifically, 3.8 eV or less) are preferably usable as a material for the cathode 4. Specific examples of the material for the cathode include the elements belonging to Groups 1 and 2 of the periodic table of the elements, a rare earth metal, and alloys thereof. The elements belonging to Group 1 of the periodic table of the elements are, for instance, alkali metal. The elements belonging to Group 2 of the periodic table of the elements are, for instance, alkaline earth metal. Examples of the alkali metal are lithium (Li) and cesium (Cs). Examples of the alkaline earth metal are magnesium (Mg), calcium (Ca), and strontium (Sr). Examples of the rare earth metal include europium (Eu) and ytterbium (Yb). Examples of the alloys containing these metals include MgAg and AlLi.

It should be noted that vacuum deposition and sputtering are usable for forming the cathode 4 from the alkali metal, alkaline earth metal and the alloy thereof. Further, for forming the anode from silver paste or the like, coating, ink jet printing and the like are usable.

When the electron injecting layer 9 is provided, various conductive materials such as Al, Ag, ITO, graphene, and indium tin oxide containing silicon or silicon oxide are usable for forming the cathode 4 irrespective of the magnitude of the work function. The conductive materials can be deposited as a film by sputtering, ink jet printing, spin coating and/or the like.

Layer Formation Method(s)

The method of forming each layer of the organic EL device 1 of the exemplary embodiment is not subject to any limitations except for those specifically described above and thus known methods such as dry film-formation method and wet film-formation method are applicable. Examples of the dry film-formation method include vacuum deposition, sputtering, plasma, and ion plating. Examples of the wet film-formation method include spin coating, dipping, flow coating, and ink-jet.

Film Thickness

The film thickness of each organic layer of the organic EL device 1 of the exemplary embodiment is not subject to any limitations except for those specifically described above. The film thickness usually preferably ranges from several nanometers to 1 µm in order to cause less defects (e.g., a pin hole) and prevent efficiency degradation resulting from requiring a high voltage to be applied.

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, the "ring carbon atoms" do not include carbon(s) contained in the substituent. Unless specifically described, the same applies to the "ring carbon atoms" described later. For instance, a benzene ring has 6 ring carbon atoms, a naphthalene ring has 10 ring carbon atoms, a pyridinyl group has 5 ring carbon atoms, and a furanyl group has 4 ring carbon atoms. When the benzene ring and/or the naphthalene ring is substituted by, for instance, an alkyl group, the number of carbon atoms of the alkyl group is not counted in the number of the ring carbon atoms. When a fluorene ring is substituted by, for instance, a fluorene ring (e.g., a spirofluorene ring), the number of carbon atoms of the fluorene ring as a substituent is not counted in the number of the ring carbon atoms for the fluorene ring.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming a ring (e.g., a hydrogen atom(s) that saturates the valence of the atom that forms the ring) and atom(s) in a substituent substituting the ring are not counted in the number of the ring atoms. Unless specifically described, the same applies to the "ring atoms" described later. For instance, a pyridine ring has 6 ring atoms, a quinazoline ring has 10 ring atoms, and a furan ring has 5 ring atoms. Respective hydrogen atoms bonded to carbon atoms of the pyridine ring or the quinazoline ring and atoms forming the substituents are not counted in the number of the ring atoms. When a fluorene ring is substituted by, for instance, a fluorene ring (e.g., a spirofluorene ring), the number of atoms of the fluorene ring as a substituent is not counted in the number of the ring atoms for the fluorene ring.

Next, each of the substituents represented by the above formulae will be described below.

Examples of the aryl group having 6 to 30 ring carbon atoms (occasionally referred to as aromatic hydrocarbon group) herein include a phenyl group, biphenyl group, terphenyl group, naphthyl group, anthryl group, phenanthryl group, fluorenyl group, pyrenyl group, chrysenyl group, fluoranthenyl group, benzo[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aryl group herein preferably has 6 to 20 ring carbon atoms, more preferably 6 to 14 ring carbon atoms, further preferably 6 to 12 ring carbon atoms. Among the above examples of the aryl group, a phenyl group, biphenyl group, naphthyl group, phenanthryl group, terphenyl group and fluorenyl group are particularly preferable. For 1-fluorenyl group, 2-fluorenyl group, 3-fluorenyl group and 4-fluorenyl group, a carbon atom at a position 9 is preferably substituted by the substituted or unsubstituted alkyl group having 1 to 30 carbon atoms or an unsubstituted aryl group having 6 to 18 ring carbon atoms described herein.

The heteroaryl group having 5 to 30 ring atoms (occasionally referred to as heterocyclic group, heteroaromatic ring group or aromatic heterocyclic group) herein preferably contains, as a hetero atom, an atom selected from the group consisting of nitrogen, sulfur, oxygen, silicon, selenium atom and germanium atom, more preferably an atom selected from the group consisting of nitrogen, sulfur, and oxygen.

Examples of the heterocyclic group having 5 to 30 ring atoms herein include a pyridyl group, pyrimidinyl group, pyrazinyl group, pyridazynyl group, triazinyl group, qui- nolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group herein preferably has 5 to 20 ring atoms, more preferably 5 to 14 ring atoms. Among the above examples of the heterocyclic group, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are particularly preferable. For 1-carbazolyl group, 2-carbazolyl group, 3-carbazolyl group and 4-carbazolyl group, a nitrogen atom at a position 9 is preferably substituted by a substituted or unsubstituted aryl group having 6 to 30 ring carbon atoms or a substituted or unsubstituted heterocyclic group having 5 to 30 ring atoms as defined herein.

The heterocyclic group herein may be a group derived from any one of moieties represented by formulae (XY-1) to (XY-18) below.

[Formula 57]

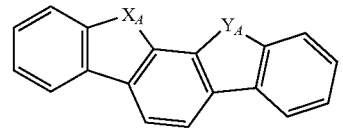

(XY-1)

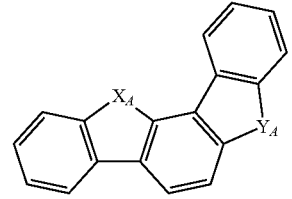

(XY-2)

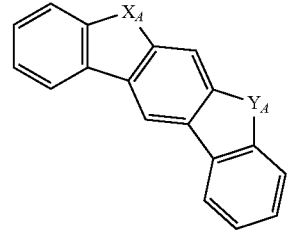

(XY-3)

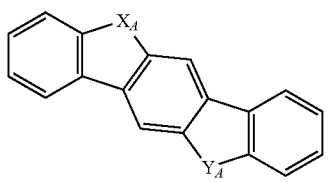
(XY-4)

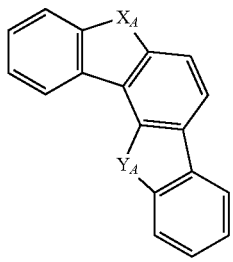
(XY-5)

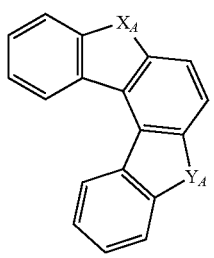
(XY-6)

[Formula 58]

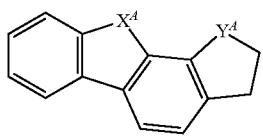
(XY-7)

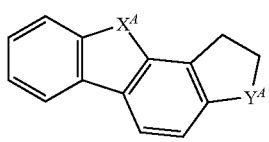
(XY-8)

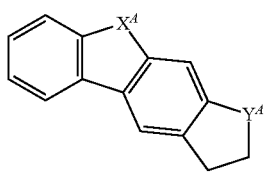
(XY-9)

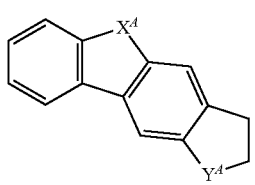
(XY-10)

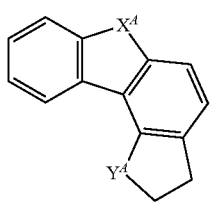
(XY-11)

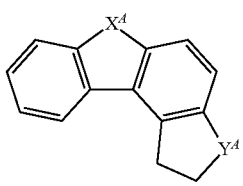
(XY-12)

[Formula 59]

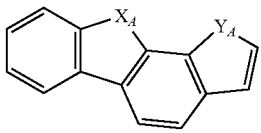
(XY-13)

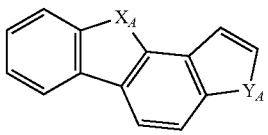
(XY-14)

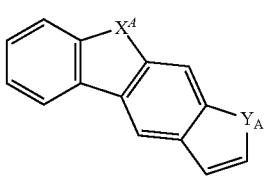
(XY-15)

(XY-16)

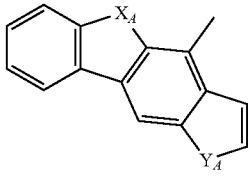
(XY-17)

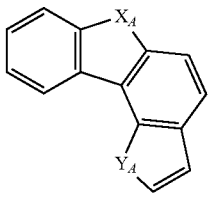
(XY-18)

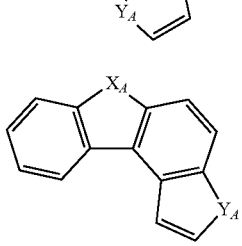

In the formulae (XY-1) to (XY-18), $X_A$ and $Y_A$ are each independently a hetero atom, preferably an oxygen atom, sulfur atom, selenium atom, silicon atom or germanium atom. The moieties represented by the formulae (XY-1) to (XY-18) may each be bonded in any position to be a heterocyclic group, which may be substituted.

The substituted or unsubstituted carbazolyl group herein may include a group in which a ring is further fused to a carbazole ring as represented by a formula below. Such a group may be substituted. The position of the bond may be changed as needed.

[Formula 60]

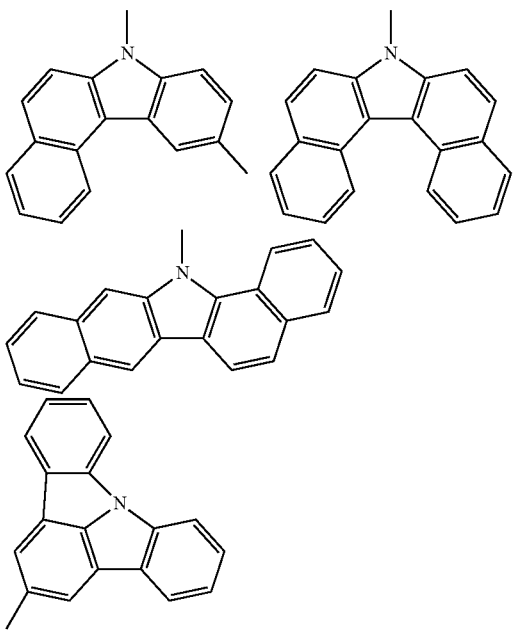

The alkyl group having 1 to 30 carbon atoms herein is linear, branched or cyclic. Examples of the linear or branched alkyl group include a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, amyl group, isoamyl group, 1-methylpentyl group, 2-methylpentyl group, 1-pentylhexyl group, 1-butylpentyl group, 1-heptyloctyl group and 3-methylpentyl group.

The linear or branched alkyl group herein preferably has 1 to 10 carbon atoms, more preferably 1 to 6 carbon atoms. Among the examples of the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are further preferable.

Examples of the cycloalkyl group having 3 to 30 carbon atoms herein include a cyclopropyl group, cyclobutyl group, cyclopentyl group, cyclohexyl group, 4-metylcyclohexyl group, adamantyl group and norbornyl group. The cycloalkyl group preferably has 3 to 20 ring carbon atoms, more preferably 3 to 10 ring carbon atoms, further preferably 5 to 8 ring carbon atoms. Among the examples of the cycloalkyl group, a cyclopentyl group and a cyclohexyl group are further preferable.

An alkyl halide group provided by substituting an alkyl group with a halogen atom is exemplified by a group provided by substituting the above-described alkyl group having 1 to 30 carbon atoms with one or more halogen atoms (i.e., an alkyl halide group having 1 to 30 carbon atoms). Specific examples of the alkyl halide group include a fluoromethyl group, difluoromethyl group, trifluoromethyl group, fluoroethyl group, trifluoromethylmethyl group, trifluoroethyl group and pentafluoroethyl group.

A substituted or unsubstituted silyl group herein includes an unsubstituted silyl group and a silyl group substituted with a substituent described herein.

Examples of the substituted silyl group herein include an alkylsilyl group having 1 to 30 carbon atoms and an arylsilyl group having 6 to 30 ring carbon atoms.

The alkylsilyl group is preferably an alkylsilyl group having 1 to 10 carbon atoms and also preferably an alkylsilyl group having 3 to 30 carbon atoms.

Examples of the alkylsilyl group having 3 to 30 carbon atoms herein include a trialkylsilyl group having the examples of the above-described alkyl group having 1 to 30 carbon atoms. Specific examples of the alkylsilyl group include a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be mutually the same or different.

Examples of the arylsilyl group having 6 to 30 ring carbon atoms herein include a dialkylarylsilyl group, alkyldiarylsilyl group and triarylsilyl group.

The dialkylarylsilyl group is exemplified by a dialkylarylsilyl group having two of the examples of the alkyl group having 1 to 30 carbon atoms and one of the aryl group having 6 to 30 ring carbon atoms. The dialkylarylsilyl group preferably has 8 to 30 carbon atoms.

The alkyldiarylsilyl group is exemplified by an alkyldiarylsilyl group having one of the examples of the alkyl group having 1 to 30 carbon atoms and two of the aryl group having 6 to 30 ring carbon atoms. The dialkylarylsilyl group preferably has 13 to 30 carbon atoms.

The triarylsilyl group is exemplified by a triarylsilyl group having three of the aryl group having 6 to 30 ring carbon atoms. The triarylsilyl group preferably has 18 to 30 carbon atoms.

An aryl group in the aralkyl group (occasionally referred to as arylalkyl group) herein is an aromatic hydrocarbon group or a heterocyclic group.

The aralkyl group having 5 to 30 carbon atoms herein is preferably an aralkyl group having 6 to 30 ring carbon atoms and is represented by —$Z_3$—$Z_4$. $Z_3$ is exemplified by an alkylene group derived from the above-described alkyl group having 1 to 30 carbon atoms. $Z_4$ is exemplified by the above-described aryl group having 6 to 30 ring carbon atoms. This aralkyl group is preferably an aralkyl group having 7 to 30 carbon atoms, in which an aryl moiety has 6 to 30 carbon atoms, preferably 6 to 20 carbon atoms, more preferably 6 to 12 carbon atoms and an alkyl moiety has 1 to 30 carbon atoms, preferably 1 to 20 carbon atoms, more preferably 1 to 10 carbon atoms, further preferably 1 to 6 carbon atoms. Examples of the aralkyl group include a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

The substituted phosphoryl group herein is represented by a formula (P) below.

[Formula 61]

(P)

In the above formula (P), $Ar_{P1}$ and $Ar_{P2}$ are each independently a substituent, preferably a substituent selected from the group consisting of an alkyl group having 1 to 30 carbon atoms and an aryl group having 6 to 30 ring carbon atoms, more preferably a substituent selected from the group consisting of an alkyl group having 1 to 10 carbon atoms and an aryl group having 6 to 20 ring carbon atoms, further preferably a substituent selected from the group consisting of an alkyl group having 1 to 6 carbon atoms and an aryl group having 6 to 14 ring carbon atoms.

The alkoxy group having 1 to 30 carbon atoms herein is represented by $-OZ_1$. $Z_1$ is exemplified by the above-described alkyl group having 1 to 30 carbon atoms. Examples of the alkoxy group include a methoxy group, ethoxy group, propoxy group, butoxy group, pentyloxy group and hexyloxy group. The alkoxy group preferably has 1 to 20 carbon atoms. Examples of the alkoxy group include a cycloalkoxy group having 3 to 30 ring carbon atoms where $Z_1$ is a cycloalkyl group having 3 to 30 carbon atoms.

Examples of the alkoxy halide group provided by substituting an alkoxy group with a halogen atom (occasionally referred to as "haloalkoxy group") include a group (i.e., a haloalkoxy group having 1 to 30 carbon atoms) provided by substituting the alkoxy group having 1 to 30 carbon atoms with one or more halogen atoms (e.g., fluorine atom).

An aryl group in the arylalkoxy group (occasionally referred to as aryloxy group) herein includes a heteroaryl group.

The arylalkoxy group having 5 to 30 carbon atoms herein is represented by $-OZ_2$. $Z_2$ is exemplified by the above-described aryl group having 6 to 30 ring carbon atoms. The arylalkoxy group preferably has 6 to 30 ring carbon atoms, more preferably 6 to 20 ring carbon atoms. This arylalkoxy group is exemplified by a phenoxy group.

A substituted or unsubstituted amino group herein includes an unsubstituted amino group and an amino group substituted with a substituent described herein.

The substituted amino group herein is represented by $-NHR_V$ or $-N(R_V)_2$. Examples of $R_V$ include the above-described alkyl group having 1 to 30 carbon atoms, the above-described aryl group having 6 to 30 ring carbon atoms, and a heterocyclic group having 5 to 30 ring atoms.

The alkenyl group having 2 to 30 carbon atoms herein is linear or branched and examples thereof include a vinyl group, propenyl group, butenyl group, oleyl group, eicosapentaenyl group, docosahexaenyl group, styryl group, 2,2-diphenylvinyl group, 1,2,2-triphenylvinyl group, and 2-phenyl-2-propenyl group.

Examples of the cycloalkenyl group having 3 to 30 carbon atoms herein include a cyclopentadienyl group, cyclopentenyl group, cyclohexenyl group, and cyclohexadienyl group.

The alkynyl group having 2 to 30 carbon atoms herein is linear or branched and examples thereof include ethynyl, propynyl, and 2-phenylethynyl.

Examples of the cycloalkynyl group having 3 to 30 carbon atoms include a cyclopentynyl group and cyclohexynyl group.

Examples of the substituted sulfanyl group herein include a methylsulfanyl group, phenylsulfanyl group, diphenylsulfanyl group, naphthylsulfanyl group, and triphenylsulfanyl group.

Examples of the substituted sulfinyl group herein include a methylsulfinyl group, phenylsulfinyl group, diphenylsulfinyl group, naphthylsulfinyl group, and triphenylsulfinyl group.

Examples of the substituted sulfonyl group herein include a methylsulfonyl group, phenylsulfonyl group, diphenylsulfonyl group, naphthylsulfonyl group, and triphenylsulfonyl group.

Examples of the substituted phosphanyl group herein include a phenylphosphanyl group.

Examples of the substituted carbonyl group herein include a methylcarbonyl group, phenylcarbonyl group, diphenylcarbonyl group, naphthylcarbonyl group, and triphenylcarbonyl group.

The alkoxycarbonyl group having 2 to 30 carbon atoms herein is represented by $-COOY'$. $Y'$ is exemplified by the above-described alkyl group.

Examples of the substituted carboxy group herein include a benzoyloxy group.

The alkylthio group having 1 to 30 carbon atoms herein is represented by $-SR_W$, $R_W$ being exemplified by the above-described alkyl group having 1 to 30 carbon atoms. The alkylthio group preferably has 1 to 20 carbon atoms.

The arylthio group having 6 to 30 ring carbon atoms herein is represented by $-SR_V$, $R_V$ being exemplified by the above-described aryl group having 6 to 30 ring carbon atoms. The arylthio group preferably has 6 to 20 ring carbon atoms.

Examples of the halogen atom herein include a fluorine atom, a chlorine atom, a bromine atom and an iodine atom, among which a fluorine atom is preferable.

"Carbon atoms forming a ring (ring carbon atoms)" herein mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

The hydrogen atom herein includes isotopes having different numbers of neutrons, i.e., protium, deuterium and tritium.

The substituent meant by "substituted or unsubstituted" herein is at least one selected from the group consisting of an aryl group having 6 to 30 ring carbon atoms, a heteroaryl group having 5 to 30 ring atoms, an alkyl group (a linear or branched alkyl group) having 1 to 30 carbon atoms, a cycloalkyl group having 3 to 30 carbon atoms, an alkyl halide group having 1 to 30 carbon atoms, an alkylsilyl group having 3 to 30 carbon atoms, an arylsilyl group having 6 to 30 ring carbon atoms, an alkoxy group having 1 to 30 carbon atoms, an aryloxy group having 5 to 30 carbon atoms, a substituted amino group, an alkylthio group having 1 to 30 carbon atoms, an arylthio group having 6 to 30 ring carbon atoms, an aralkyl group having 5 to 30 carbon atoms, an alkenyl group having 2 to 30 carbon atoms, an alkynyl group having 2 to 30 carbon atoms, a halogen atom, a cyano group, a hydroxyl group, a nitro group, and a carboxy group.

The substituent meant by "substituted or unsubstituted" herein is preferably at least one selected from the group consisting of an aryl group having 6 to 30 ring carbon atoms, a heteroaryl group having 5 to 30 ring atoms, an alkyl group (a linear or branched alkyl group) having 1 to 30 carbon atoms, a cycloalkyl group having 3 to 30 carbon atoms, an alkyl halide group, a halogen atom, an alkylsilyl group having 3 to 30 carbon atoms, an arylsilyl group having 6 to 30 ring carbon atoms, and a cyano group, more preferably the specific substituents referred to as being preferable in the explanation of the above-described substituents.

The substituent meant by "substituted or unsubstituted" herein may be further substituted with at least one group selected from the group consisting of an aryl group having 6 to 30 ring carbon atoms, a heteroaryl group having 5 to 30 ring atoms, an alkyl group (a linear or branched alkyl group) having 1 to 30 carbon atoms, a cycloalkyl group having 3 to 30 carbon atoms, an alkyl halide group, an alkylsilyl group having 3 to 30 carbon atoms, an arylsilyl group having 6 to 30 ring carbon atoms, an alkoxy group having 1 to 30 carbon atoms, an aryloxy group having 5 to 30 carbon atoms, a substituted amino group, an alkylthio group having 1 to 30 carbon atoms, an arylthio group having 6 to 30 ring carbon atoms, an aralkyl group having 5 to 30 carbon atoms, an alkenyl group having 2 to 30 carbon atoms, an alkynyl group having 2 to 30 carbon atoms, a halogen atom, a cyano group, a hydroxyl group, a nitro group, and a carboxy group. In addition, two or more of these substituents may be mutually bonded to form a ring.

The term "unsubstituted" used in "substituted or unsubstituted" herein means that a group is not substituted by the above-described substituents but bonded with a hydrogen atom.

"XX to YY carbon atoms" in the expression "substituted or unsubstituted ZZ group having XX to YY carbon atoms" herein mean carbon atoms of an unsubstituted ZZ group and do not include carbon atoms of a substituent(s) of the substituted ZZ group. Herein, "YY" is larger than "XX" and "XX" and "YY" are each an integer of 1 or more.

"XX to YY atoms" in the expression "substituted or unsubstituted ZZ group having XX to YY atoms" herein mean atoms of an unsubstituted ZZ group and do not include atoms of a substituent(s) of the substituted ZZ group. Herein, "YY" is larger than "XX" and "XX" and "YY" are each an integer of 1 or more.

The above also applies to the expression "substituted or unsubstituted" used for compounds or moieties thereof described herein.

When substituents are mutually bonded to form a ring, the structure of the ring herein is a saturated ring, unsaturated ring, aromatic hydrocarbon ring, or heterocyclic ring.

Examples of the aromatic hydrocarbon group, the heterocyclic group, and the like for the linking group herein include a divalent or multivalent group obtained by removing at least one atom from the above-described monovalent groups.

Electronic Device

The organic EL device 1 of the exemplary embodiments is usable in an electronic device. Examples of the electronic device include a display device and a light-emitting device. Examples of the display include display components such as an organic EL panel module, TV, mobile phone, tablet, and personal computer. Examples of the light-emitting unit include an illuminator and a vehicle light.

Modification of Embodiment(s)

It should be noted that the invention is not limited to the above exemplary embodiment(s) but may include any modifications and improvements as long as an object of the invention can be achieved.

For instance, the emitting layer is not limited to a single layer, but provided by laminating a plurality of emitting layers in some exemplary embodiments. The organic EL device may be provided by the plurality of emitting layers as long as at least one of the emitting layers satisfies the conditions described in the above exemplary embodiment. For instance, the rest of the emitting layers include a fluorescent emitting layer or a phosphorescent emitting layer in some exemplary embodiments.

The plurality of emitting layers of the organic EL device are in contact with each other or layered via an intermediate layer to provide a so-called tandem-type organic EL device in some exemplary embodiments.

For instance, a blocking layer is in contact with at least one of an anode-side or a cathode-side of the emitting layer in some exemplary embodiments. The blocking layer is preferably in contact with the emitting layer, blocking at least one of holes, electrons or excitons.

For instance, when the blocking layer is in contact with the cathode-side of the emitting layer, the blocking layer permits transport of electrons, but prevents holes from reaching a layer provided near the cathode (e.g., the electron transporting layer) beyond the blocking layer. When the organic EL device includes the electron transporting layer, the organic EL device preferably includes the blocking layer between the emitting layer and the electron transporting layer.

When the blocking layer is in contact with the emitting layer near the anode, the blocking layer permits transport of holes, but prevents electrons from reaching a layer provided near the anode (e.g., the hole transporting layer) beyond the blocking layer. When the organic EL device includes the hole transporting layer, the organic EL device preferably includes the blocking layer between the emitting layer and the hole transporting layer.

Moreover, the blocking layer is in contact with the emitting layer so that excited energy does not leak out from the emitting layer toward a neighboring layer(s) in some exemplary embodiments. The blocking layer thus blocks excitons generated in the emitting layer from transferring to a layer(s) (e.g., the electron transporting layer and the hole transporting layer) closer to the electrode(s) beyond the blocking layer.

The emitting layer and the blocking layer preferably abut on each other.

The arrangement of the organic layer is not limited to that of the above exemplary embodiment. The organic layer includes the emitting layer, the hole transporting layer between the emitting layer and the anode, and the electron transporting layer between the emitting layer and the cathode in some exemplary embodiments.

Specific structures and shapes of the components according to the invention may be altered in any manner as long as an object of the invention can be achieved.

EXAMPLE(S)
Examples of the invention will be described below. However, the invention is by no means limited to Examples.
Compounds
Compounds used for producing the organic EL devices are shown below.
[Formula 62]
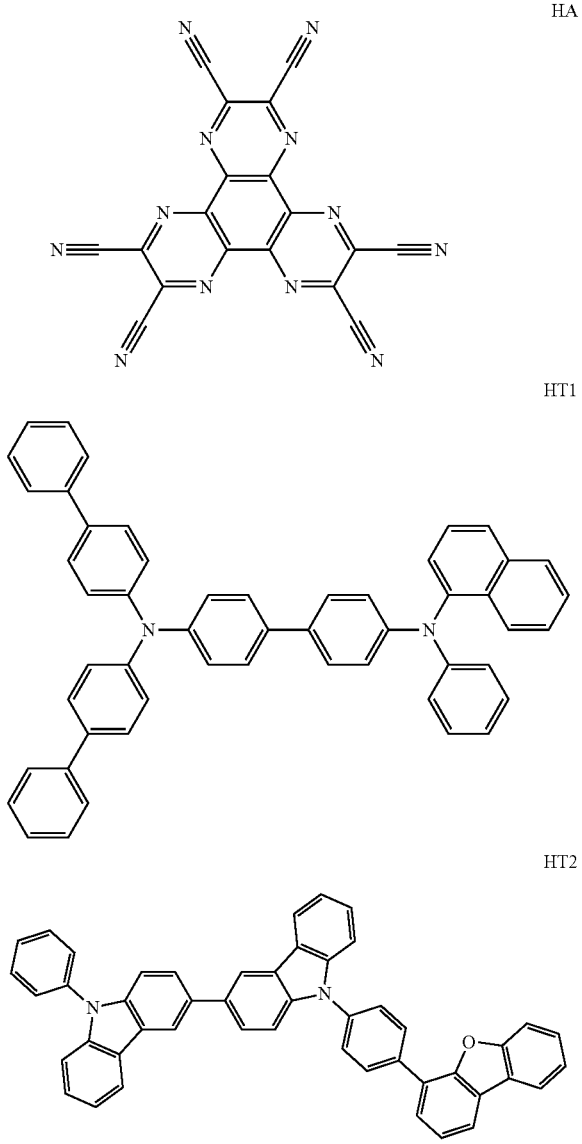
[Formula 63]
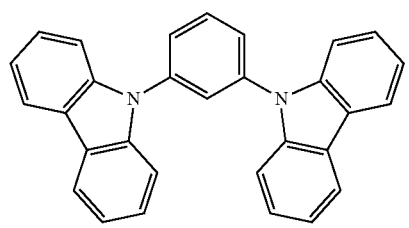

[Formula 65]
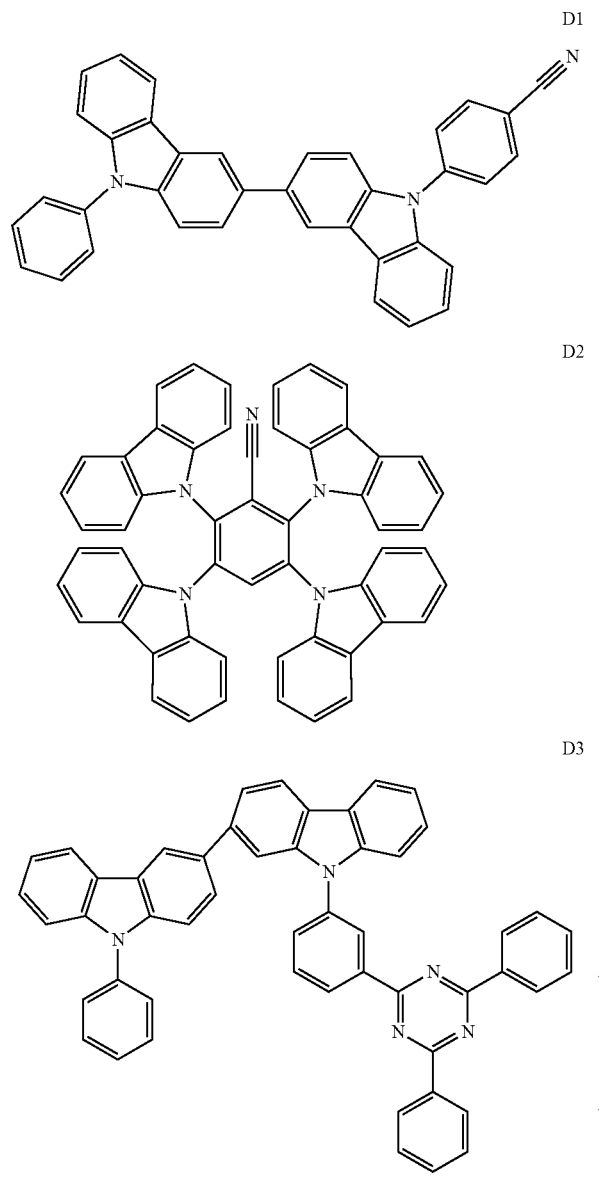
D1
D2
D3
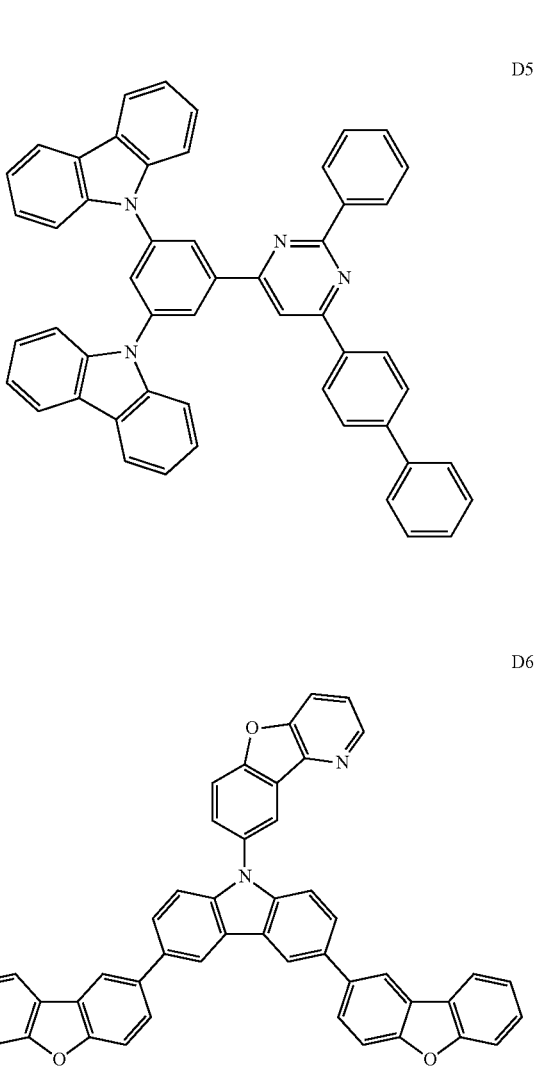
D5
D6
[Formula 66]
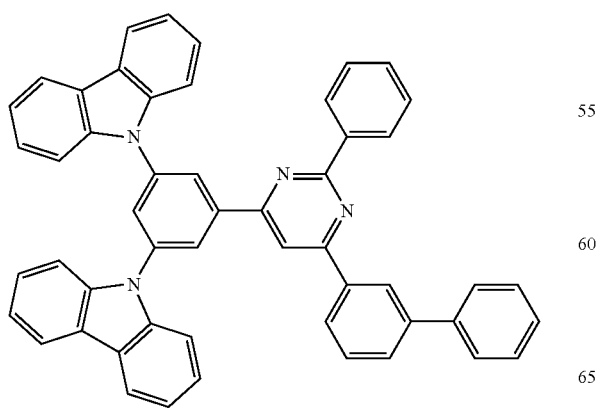
D4
[Formula 67]
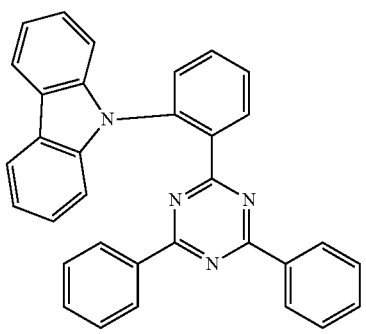
D7

-continued

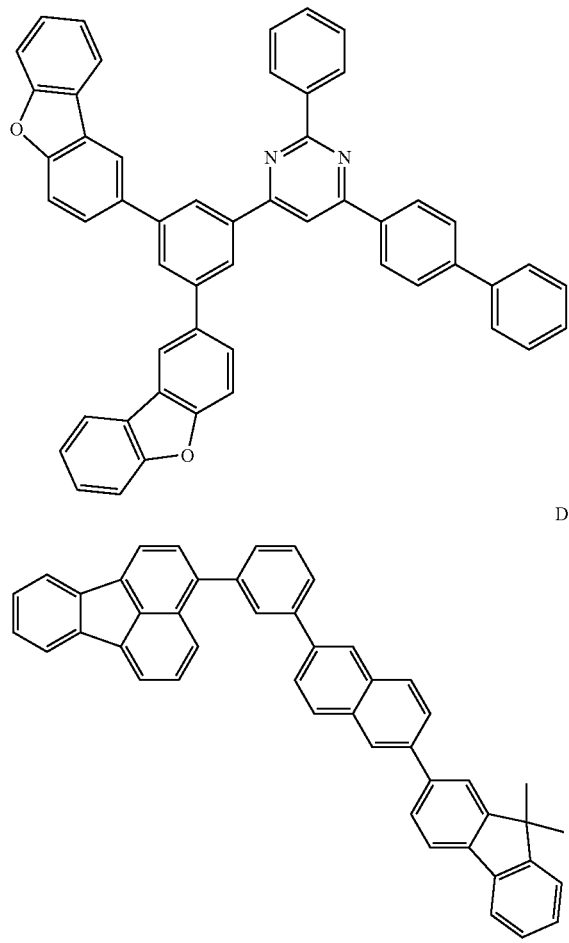

[Formula 68]

-continued

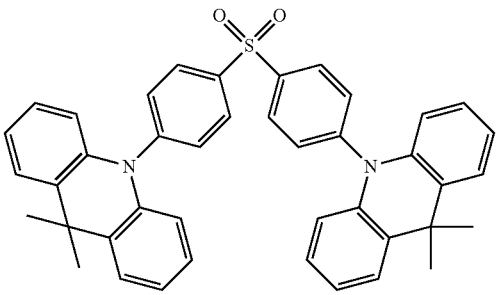

[Formula 69]

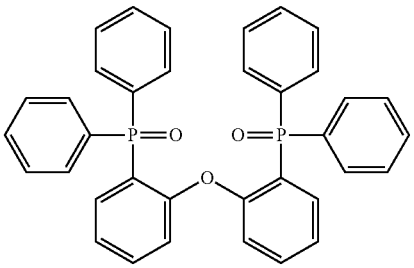

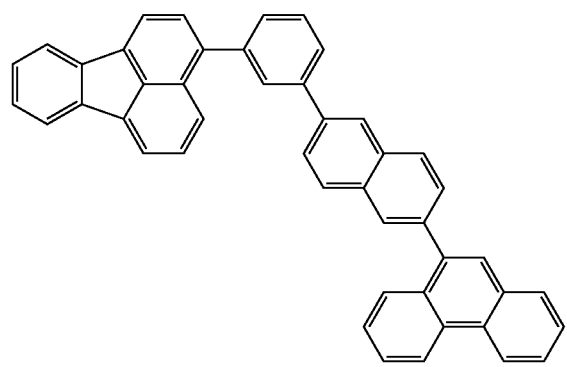

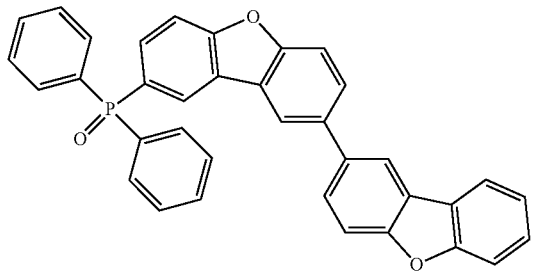

Evaluation of Compounds

Next, properties of the compounds used in Example were measured. The measurement method and calculation method are shown below.

Measurement Method of Ionization Potential

Ionization potential was measured using a photoelectron spectroscope (AC-3, manufactured by Riken Keiki Co., Ltd.) in atmosphere. Specifically, the target compound was irradiated with light and the amount of electrons generated by charge separation was measured.

The ionization potential Ip1 of the compound H1 was 5.54 eV.

The ionization potential Ip2 of the compound BD1 was 6.27 eV.

Thus, Ip2−Ip1=0.73 eV.

Delayed Fluorescence

Delayed fluorescence was found by measuring transient PL using the device shown in FIG. 2. A sample was prepared by co-depositing the compounds H1 and TH-2 on a quartz substrate such that a concentration of the compound H1 reached 12 mass % to form a 100-nm-thick thin film. The compound H1 allows for Prompt emission, which is observed immediately when the excited state is achieved by exciting the compound H1 with pulsed light (i.e., light emitted from the pulse laser unit) having a wavelength absorbable into the compound H1, and Delay emission, which is observed not immediately upon the excitation but after a while. The delayed fluorescence in Examples means that an amount of Delay emission is 5% or more with respect to an amount of Prompt emission. Specifically, when the amount of Prompt emission is denoted by $X_P$ and the amount of Delay emission is denoted by $X_D$, a value of $X_D/X_P$ is 0.05 or more.

The compound H1 has proven to achieve the amount of Delay emission of 5% or more with respect to the amount of Prompt emission. Specifically, the compound H1 has proven to achieve a value of $X_D/X_P$ of 0.05 or more.

The respective amounts of Prompt emission and Delay emission can be determined by the same method as described in "Nature 492, 234-238, 2012." It should be noted that a device used for calculating the respective amounts of Prompt emission and Delay emission is not limited to the device of FIG. 2 and a device described in the above literature.

Electron Mobility

The electron mobility can be measured by impedance spectroscopy as follows.

A device including at least an anode, a cathode and a layer interposed between the anode and the cathode was produced, the layer containing a compound Target for electron mobility measurement (occasionally referred to as "compound-Target-containing layer"). A film thickness of the compound-Target-containing layer was 200 nm. A minute AC voltage of 0.1 V was applied to the device while a bias DC voltage was applied thereto. A value of the resulting alternating current (absolute value and phase) was measured. The measurement was performed with the frequency of the AC voltage being changed and a complex impedance (Z) was calculated from the current value and the voltage value. Specifically, the frequency dependence of an imaginary part (ImM) of a modulus $M=i\omega Z$ (i: imaginary unit, $\omega$: angular frequency) was calculated and the inverse number of the frequency $\omega$ at the maximum of ImM was defined as a response time of electrons that propagated in the layer containing the compound Target. The electron mobility (unit: $cm^2/(V \cdot s)$) was then calculated by a calculation formula below.

electron mobility=(film thickness of compound–Target–containing layer)$^2$/(response time×voltage) (Calculation Formula)

More specifically, a device for mobility evaluation was produced as follows to measure the electron mobility in Examples.

A glass substrate (size: 25 mm×75 mm×1.1 mm-thickness) was ultrasonic-cleaned in isopropyl alcohol for five minutes. After being ultrasonic-cleaned, the glass substrate was UV/ozone-cleaned for 30 minutes.

The thus-cleaned glass substrate was mounted on a substrate holder of a vacuum deposition apparatus and metal aluminum (Al) was first vapor-deposited thereon to form an 80-nm-thick metal Al anode.

Subsequently, on a surface provided with the metal Al anode line, the compound Target (a target for electron mobility measurement) was vapor-deposited into a 200-nm-thick film, covering the metal Al anode.

The compound ET2 was then vapor-deposited on the compound Target to form a 10-nm-thick electron transporting layer.

Lithium fluoride (LiF) was then vapor-deposited on the electron transporting layer to form a 1-nm-thick electron injecting electrode (cathode).

A metal aluminum (Al) was then vapor-deposited on the electron injecting electrode to form an 80-nm-thick metal Al cathode.

The arrangement of the device for mobility evaluation is schematically shown as follows.

*Al*(80)/*Target*(200)/*ET2*(10)/*LiF*(1)/*Al*(80)

Numerals in parentheses represent a film thickness (unit: nm).

Subsequently, the electron mobility was measured with the thus-produced device for mobility evaluation as follows.

The device for mobility evaluation was mounted on an impedance measuring machine to perform impedance measurement.

The impedance measurement was performed by sweeping a measurement frequency from 1 Hz to 1 MHz. At this time, an AC voltage of 0.1 V and a bias DC voltage V were simultaneously applied to the device for mobility evaluation.

The modulus M was calculated from the measured complex impedance (Z) by a calculation formula (C1) below.

$M=i\omega Z$  Calculation Formula (C1):

In the calculation formula (C1), i is an imaginary unit whose square is −1 and $\omega$ is an angular frequency [rad/s].

With reference to a Bode plot where the ordinate axis represents the imaginary part of the modulus M and the abscissa axis represents frequency [Hz], an electric time constant $\tau$[s] of the device for mobility evaluation was calculated from a frequency $f_{max}$ (peak) by a calculation formula (C2) below.

$\tau=1/(2\pi f_{max})$  Calculation Formula (C2):

$\pi$ in the calculation formula (C2) is a sign denoting the circular constant.

With the time constant $\tau$, the electron mobility $\mu$ [$cm^2/(V \cdot s)$] was calculated based on the relationship of a calculation formula (C3) below.

$\mu=d^2/(V\tau)$  Calculation Formula (C3):

The "mobility" herein means a value at a square root of electric field intensity $E^{1/2}=500$ [$V^{1/2}/cm^{1/2}$]. The square root $E^{1/2}$ of electric field intensity was calculated from a calculation formula (C4) below.

$E^{1/2}=V^{1/2}/d^{1/2}$  Calculation Formula (C4):

In the calculation formulae (C3) and (C4), d is a total film thickness of an organic thin film of the device and d=210 [nm] for the above-described device for mobility evaluation.

In the calculation formulae (C3) and (C4), V is the bias DC voltage [V] for the impedance measurement. According to measurement conditions for Examples, the square root of electric field intensity $E^{1/2}=500$ [$V^{1/2}/cm^{1/2}$] at V=5.25 [V]. Thus, the electron mobility in Examples is a value at a bias DC voltage V=5.25 [V]. It should be noted that the measurement cannot be performed at V=5.25 [V] depending on a later-described measurement step. In such a case, an extrapolation number relative to a measurement point around V=5.25[V] was used instead.

The bias DC voltage is described in detail below.

In the measurement method used in Examples, a sweep range of the bias DC voltage, which varied depending on the device for mobility evaluation, was in a range of 0 V to 20 V at most. The sweep range is set different, since a device for mobility evaluation with a lower electron mobility requires a higher voltage to achieve charge injection sufficient for the measurement and the upper limit of the sweep range needs to be set higher, accordingly.

The measurement was performed at a constant voltage within the above sweep range. It should be noted that the measurement points are set by 0.2-V increments when the upper limit of the sweep range for the measurement is low, whereas the measurement points are set by 0.8-V increments when the measurement is performed at a high voltage up to almost 20 V, thereby adjusting the measurement step such that the measurement time is not extremely increased depending on the sweep range of the voltage.

In Examples, the impedance measurement was performed using an impedance analyzer 1260 manufactured by Solartron, which was combined with a permittivity measurement interface 1296 manufactured by Solartron for a higher accuracy.

Singlet Energy $S_1$

Singlet energy $S_1$ was measured as follows.

A 10 µmol/L toluene solution of a target compound was prepared and put in a quartz cell. An absorption spectrum (ordinate axis: luminous intensity, abscissa axis: wavelength) of the thus-obtained sample was measured at a normal temperature (300K). A tangent was drawn to a fall of the absorption spectrum on the long-wavelength side and a wavelength value $\lambda_{edge}$ [nm] at an intersection between the tangent and the abscissa axis was assigned to a conversion equation (F2) below to calculate the singlet energy.

$$S_1 [eV] = 1239.85/\lambda_{edge} \quad \text{Conversion Equation (F2):}$$

In Examples, the absorption spectrum was measured using a spectrophotometer (device name: U3310, manufactured by Hitachi, Ltd.).

The tangent to the fall of the absorption spectrum on the long-wavelength side was drawn as follows. While moving on a curve of the absorption spectrum from the maximum spectral value closest to the long-wavelength side in a long-wavelength direction, a tangent at each point on the curve was checked. An inclination of the tangent was decreased and increased in a repeated manner as the curve fell (i.e., a value of the ordinate axis was decreased). A tangent drawn at a point of the minimum inclination closest to the long-wavelength side (except when absorbance was 0.1 or less) was defined as the tangent to the fall of the absorption spectrum on the long-wavelength side.

The maximum absorbance of 0.2 or less was not included in the above-mentioned maximum absorbance on the long-wavelength side.

Energy Gap $T_{77K}$ at 77[K]

A measurement sample was prepared by putting in a quartz cell a target compound dissolved in EPA (diethylether:isopentane:ethanol=5:5:2 in volume ratio) such that the concentration reached 10 µmol/L. A phosphorescence spectrum (ordinate axis: phosphorescent luminous intensity, abscissa axis: wavelength) of the measurement sample was measured at a low temperature (77[K]). A tangent was drawn to a rise of the phosphorescence spectrum on the short-wavelength side. An energy amount calculated from a wavelength value $\lambda_{edge}$ [nm] at an intersection between the tangent and the abscissa axis using a conversion equation (F1) below was defined as the energy gap $T_{77K}$ at 77[K].

$$T_{77K}[eV] = 1239.85/\lambda_{edge} \quad \text{Conversion Equation:}$$

The tangent to the rise of the phosphorescence spectrum on the short-wavelength side was drawn as follows. While moving on a curve of the phosphorescence spectrum from the short-wavelength side to the maximum spectral value closest to the short-wavelength side among the maximum spectral values, a tangent was checked at each point on the curve toward the long-wavelength of the phosphorescence spectrum. An inclination of the tangent was increased as the curve rose (i.e., a value of the ordinate axis was increased). A tangent drawn at a point of the maximum inclination (i.e., a tangent at an inflection point) was defined as the tangent to the rise of the phosphorescence spectrum on the short-wavelength side.

The maximum with peak intensity being 15% or less of the maximum peak intensity of the spectrum was not included in the above-mentioned maximum closest to the short-wavelength side of the spectrum. The tangent drawn at a point of the maximum spectral value being closest to the short-wavelength side and having the maximum inclination was defined as a tangent to the rise of the phosphorescence spectrum on the short-wavelength side.

For phosphorescence measurement, a spectrophotofluorometer body F-4500 (manufactured by Hitachi High-Technologies Corporation) was used.

$S_1(H)$ of the compound H1 was 2.92 eV.
$T_{77K}(H)$ of the compound H1 was 2.91 eV.
$\Delta ST(H)$ of the compound H1 was 0.01 eV.

Main Peak Wavelength of Compound

A toluene solution in which the target compound was dissolved at a concentration ranging from $10^{-6}$ mol/l or more to $10^{-6}$ mol/l or less was prepared and a luminescence spectrum of the toluene solution was measured. In the luminescence spectrum, a peak wavelength at which the luminous intensity was maximized was defined as a main peak wavelength.

The main peak wavelength of the compound BD1 was 465 nm.

Measurement Method of Luminescence Quantum Efficiency

A luminescence quantum efficiency $\Phi$ was measured as follows.

A solution of a sample (target) was prepared using toluene as a solvent. The prepared sample solution was put in a 1-cm cell to measure an absorption spectrum with an absorptiometer. Based on the absorption spectrum as measured, an excitation wavelength was determined for luminescence spectrum measurement. It should be noted that the excitation wavelength is desirably, but not limited thereto, a wavelength providing an absorption peak. A concentration of the sample solution was desirably lowered to reduce reabsorption of the emission. For the measurement, the concentration of the sample solution was adjusted such that an absorbance at the excitation wavelength became 0.05 or less.

The thus-prepared sample solution was put in a glass sample tube with a vacuum cock. The sample tube was connected to a vacuum line including a vacuum pump and a vacuum gauge and freeze-deaerated. The "freeze-deaeration" for the measurement refers to a process of immersing a solution reservoir of the sample tube in liquid nitrogen and vacuating the sample tube after freezing the sample solution. For the measurement, the vacuum pump was a rotary pump and the vacuum gauge was a Pirani vacuum gauge. However, the vacuum pump and the vacuum gauge are not limited to the specific types of vacuum pump and vacuum gauge as used for the measurement.

The freeze-deaerated sample solution was dissolved at room temperature and then again freeze-deaerated. This process was repeated until the vacuum degree got settled. The solution obtained by repeating the above process was defined as a deaerated sample solution.

The sample tube containing the deaerated sample solution and a 1-cm lidded cell were put in a glove box. Under an inert gas (e.g., nitrogen) atmosphere in the glove box, the deaerated sample solution was transferred from the sample tube to the lidded cell and the lidded cell was sealed. The sealed lidded cell was taken out of the glove box and a luminescence spectrum of the deaerated sample solution was measured using a fluorometer. A line connecting a rise of the obtained luminescence spectrum on the short-wavelength side and a rise thereof on the long-wavelength side was defined as a reference line, based on which an area intensity $F_1$ of the luminescence was calculated.

The same process as described above was performed on a standard sample with a known luminescence quantum efficiency to calculate an area intensity $F_2$ of the luminescence of a deaerated standard sample solution.

The luminescence quantum efficiency Φ of the target sample was calculated by an expression (A) below.

$$\Phi = \Phi_2 \times \{(F_1 A_2 n_1^2)/(F_2 A_1 n_2^2)\} \quad \text{(Expression A)}$$

Here, in the (Expression A), $\Phi_2$ is a luminescence quantum efficiency of the standard sample, $A_1$ is an absorbance at the excitation wavelength of the sample solution, $A_2$ is an absorbance at the excitation wavelength of the standard sample solution, $n_1$ is a reflective index of a solvent used for preparing the sample solution, and $n_2$ is a reflective index of a solvent used for preparing the standard sample solution.

In Examples, an ethanol solution of 9,10-diphenylanthracene was used for the standard sample solution and $\Phi_2 = 0.95$ (Morris et al., J. Phys. Chem., 80(1976)969.).

Further, $n_1 = 1.498$ (toluene) and $n_2 = 1.362$ (ethanol) ("Kagaku-Binran, Kiso-hen (*Handbook of Chemistry, Basic*), fifth revision", Chapter 14, page 11-640, issued on Feb. 1, 2004).

The absorption spectrum measuring device was an absorptiometer (device name: UV-3100PC) manufactured by Shimadzu Corporation and the luminescence spectrum measuring device was a spectrophotofluorometer (device name: F-4500) manufactured by Hitachi, Ltd.

It should be noted that the solution is not limited to the above solution used for the measurement and the solvent is not limited to the above solvent used for the measurement, as long as the standard sample solution has a known luminescence quantum efficiency. In addition, the absorption spectrum measuring device and the luminescence spectrum measuring device are not limited to the above devices used for the measurement.

The luminescence quantum efficiency of the compound H1 measured by the above method was 53%.

Evaluation of Organic EL Devices

The organic EL devices were produced in the following manner and evaluated.

Example 1

A glass substrate (size: 25 mm×75 mm×1.1 mm-thickness, manufactured by Geomatec Co., Ltd.) having an ITO transparent electrode (anode) was ultrasonic-cleaned in isopropyl alcohol for five minutes. After being ultrasonic-cleaned, the glass substrate was UV/ozone-cleaned for 30 minutes. A film of ITO was 130 nm thick.

The thus-cleaned glass substrate was mounted on a substrate holder of a vacuum deposition apparatus. Initially, the compound HA was vapor-deposited on a surface of the glass substrate where the transparent electrode line was provided in a manner to cover the transparent electrode, thereby forming a 5-nm-thick hole injecting layer.

The compound HT1 was then vapor-deposited on the hole injecting layer to form an 80-nm-thick first hole transporting layer.

The compound HT2 was then vapor-deposited on the first hole transporting layer to form a 10-nm-thick second hole transporting layer.

The compound mCP was then vapor-deposited on the second hole transporting layer to form a 5-nm-thick electron blocking layer.

The compound H1 (first compound), the compound BD1 (second compound), and the compound D1 (third compound) were then co-deposited on the electron blocking layer to form a 25-nm-thick emitting layer. The concentration of the compound BD1 was set at 1 mass %, the concentration of the compound $D_1$ was set at 25 mass %, and the concentration of the compound H1 was set at 74 mass % in the emitting layer.

The compound ET1 was then vapor-deposited on the emitting layer to form a 5-nm-thick hole blocking layer.

The compound ET2 was then vapor-deposited on the hole blocking layer to form a 20-nm-thick electron transporting layer.

Lithium fluoride (LiF) was then vapor-deposited on the electron transporting layer to form a 1-nm-thick electron injecting electrode (cathode).

A metal aluminum (Al) was then vapor-deposited on the electron injecting electrode to form an 80-nm-thick metal Al cathode.

A device arrangement of the organic EL device in Example 1 is schematically shown as follows.

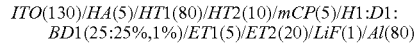
ITO(130)/HA(5)/HT1(80)/HT2(10)/mCP(5)/H1:D1: BD1(25:25%,1%)/ET1(5)/ET2(20)/LiF(1)/Al(80)

Numerals in parentheses represent a film thickness (unit: nm). A first percentage (mass %) in parentheses is a ratio of the third compound in the emitting layer and a second percentage (mass %) in the parentheses is a ratio of the second compound.

Example 2

An organic EL device of Example 2 was produced in the same manner as the organic EL device of Example 1 except that the compound D1 in the emitting layer of Example 1 was replaced with the compound D2.

Example 3

An organic EL device of Example 3 was produced in the same manner as the organic EL device of Example 1 except that the compound D1 in the emitting layer of Example 1 was replaced with the compound D3.

Example 4

An organic EL device of Example 4 was produced in the same manner as the organic EL device of Example 1 except that the compound D1 in the emitting layer of Example 1 was replaced with the compound D4.

Example 5

An organic EL device of Example 5 was produced in the same manner as the organic EL device of Example 1 except that the compound D1 in the emitting layer of Example 1 was replaced with the compound D5.

Example 6

An organic EL device of Example 6 was produced in the same manner as the organic EL device of Example 1 except that the compound D1 in the emitting layer of Example 1 was replaced with the compound D6.

Example 7

An organic EL device of Example 7 was produced in the same manner as the organic EL device of Example 1 except that the compound D1 in the emitting layer of Example 1 was replaced with the compound D7.

Example 8

An organic EL device of Example 8 was produced in the same manner as the organic EL device of Example 1 except that the compound D1 in the emitting layer of Example 1 was replaced with the compound ET1.

Example 9

An organic EL device of Example 9 was produced in the same manner as the organic EL device of Example 1 except that the compound D1 in the emitting layer of Example 1 was replaced with the compound D8.

Example 10

An organic EL device of Example 10 was produced in the same manner as the organic EL device of Example 1 except that the compound D1 in the emitting layer of Example 1 was replaced with the compound D9.

Example 11

An organic EL device of Example 11 was produced in the same manner as the organic EL device of Example 1 except that the compound D1 in the emitting layer of Example 1 was replaced with the compound D10.

Example 12

An organic EL device of Example 12 was produced in the same manner as the organic EL device of Example 1 except that the compound D1 in the emitting layer of Example 1 was replaced with the compound ET2.

Reference Example 1

An organic EL device of Reference Example 1 was produced in the same manner as the organic EL device of Example 1 except that the compound D1 in the emitting layer of Example 1 was replaced with the compound C1.

Reference Example 2

An organic EL device of Reference Example 2 was produced in the same manner as the organic EL device of Example 1 except that the compound D1 in the emitting layer of Example 1 was replaced with the compound C3.

Comparative Example 1

An organic EL device of Comparative Example 1 was produced in the same manner as the organic EL device of Example 1 except that the compound D1 in the emitting layer of Example 1 was replaced with the compound DA-1.

Evaluation of Organic EL Devices

The produced organic EL devices were evaluated as follows. The evaluation results are shown in Table 2.

CIE1931 Chromaticity and Main Peak Wavelength $\lambda_p$

Voltage was applied to each of the organic EL devices such that a current density was 0.1 mA/cm² and coordinates (x, y) of CIE1931 chromaticity were measured using a spectroradiometer (CS-2000 manufactured by Konica Minolta, Inc.). The main peak wavelength $\lambda_p$ was determined from the obtained spectral radiance spectra.

External Quantum Efficiency, EQE

Voltage was applied to each of the organic EL devices such that a current density was 0.1 mA/cm² and spectral radiance spectra were measured using the above spectroradiometer. The external quantum efficiency, EQE, (unit: %) was calculated based on the obtained spectral-radiance spectra, assuming that the spectra was provided under a Lambertian radiation.

Lifetime (LT50)

A continuous current test under direct current was performed with an initial current density of 10 mA/cm² and time (unit; h) expired before the luminance dropped to 50% of the initial level at the start of the test was determined as a lifetime (LT50). It should be noted that Table shows that the respective lifetimes of Examples 10 to 12 are 50 hours or more.

TABLE 2

| | Third Compound | | | | Properties of Device | | | | |
|---|---|---|---|---|---|---|---|---|---|
| | Material Name | Electron Mobility (cm²/(V·s)) | $T_{77K}$ (eV) | $\Delta T(H-E)$ (eV) | CIEx | CIEy | $\lambda p$ (nm) | EQE (%) | LT50 (h) |
| Ex. 1 | D1 | $6.7 \times 10^{-7}$ | 2.87 | 0.04 | 0.157 | 0.270 | 469 | 14.0 | 39.4 |
| Ex. 2 | D2 | $3.3 \times 10^{-7}$ | 2.87 | 0.04 | 0.162 | 0.267 | 468 | 14.2 | 38.6 |
| Ex. 3 | D3 | $1.8 \times 10^{-6}$ | 2.74 | 0.17 | 0.159 | 0.275 | 469 | 15.1 | 58.8 |
| Ex. 4 | D4 | $2.6 \times 10^{-5}$ | — | — | 0.153 | 0.250 | 468 | 15.7 | 39.7 |
| Ex. 5 | D5 | $1.1 \times 10^{-4}$ | 2.65 | 0.26 | 0.155 | 0.259 | 468 | 13.6 | 61.0 |
| Ex. 6 | D6 | $1.8 \times 10^{-7}$ | 2.97 | −0.06 | 0.148 | 0.254 | 469 | 17.4 | 43.5 |
| Ex. 7 | D7 | $3.9 \times 10^{-4}$ | 2.95 | −0.04 | 0.159 | 0.250 | 467 | 12.1 | 52.1 |
| Ex. 8 | ET1 | $2.1 \times 10^{-5}$ | 2.90 | 0.01 | 0.155 | 0.251 | 468 | 15.5 | 41.7 |
| Ex. 9 | D8 | $2.6 \times 10^{-4}$ | 2.68 | 0.23 | 0.153 | 0.252 | 468 | 14.1 | 55.4 |
| Ex. 10 | D9 | $1.0 \times 10^{-4}$ | 2.27 | 0.64 | 0.142 | 0.225 | 468 | 5.5 | >50 |
| Ex. 11 | D10 | $8.1 \times 10^{-5}$ | 2.28 | 0.63 | 0.139 | 0.219 | 468 | 5.7 | >50 |
| Ex. 12 | ET2 | $5.5 \times 10^{-4}$ | 1.78 | 1.13 | 0.139 | 0.209 | 467 | 5.1 | >50 |
| Ref. 1 | C1 | $4.2 \times 10^{-9}$ | 3.04 | −0.13 | 0.151 | 0.245 | 467 | 12.9 | 17.0 |
| Ref. 2 | C3 | $2.0 \times 10^{-11}$ | 3.08 | −0.17 | 0.155 | 0.244 | 467 | 8.4 | 3.5 |
| Comp. 1 | DA-1 | off-scale low | 3.50 | −0.59 | 0.155 | 0.250 | 467 | 11.7 | 3.7 |

Each of the organic EL devices of Examples 1 to 12, which satisfied the relationship of the numerical expression (Numerical Expression 1) between the ionization potential Ip1 of the first compound (compound H1) and the ionization potential Ip2 of the second compound (BD1) and contained a compound with an electron mobility of $1 \times 10^{-8}$ cm²/(V·s) or more as the third compound, had a long lifetime as compared with the organic EL devices of Reference Examples 1 to 2 and Comparative Example 1.

In Examples 1 to 9, the emitting layer was formed by combining compounds such that a difference $\Delta T(H-E)$ between $T_{77K}(H)$ of the first compound and $T_{77K}(E)$ of the third compound satisfied the relationship of the numerical expression (Numerical Expression 3). As a result, each of the organic EL devices of Examples 1 to 9 exhibited a high EQE.

The invention claimed is:

1. An organic electroluminescence device, comprising:
an anode;
an emitting layer; and
a cathode,
wherein the emitting layer comprises a first compound, a second compound, and a third compound,
an ionization potential Ip1 of the first compound and an ionization potential Ip2 of the second compound satisfy a relationship represented by a numerical expression:

$$0 \le Ip2 - Ip1 - 0.8 [eV],$$

the first compound is a delayed fluorescent compound,
the second compound is a fluorescent compound, and
the third compound has an electron mobility of $1 \times 10^{-8}$ cm$^2$/(V·s) or more.

2. The organic electroluminescence device according to claim 1, wherein a difference ΔST(H) between a singlet energy $S_1$(H) of the first compound and an energy gap $T_{77K}$(H) at 77[K] of the first compound satisfies a relationship:

$$\Delta ST(H) = S_1(H) - T_{77K}(H) < 0.3 \ [eV].$$

3. The organic electroluminescence device according to claim 1, wherein a difference ΔT(H-E) between an energy gap $T_{77K}$(H) at 77[K] of the first compound and an energy gap $T_{77K}$(E) at 77[K] of the third compound satisfies a relationship represented by a numerical expression:

$$\Delta T(H-E) = T_{77K}(H) - T_{77K}(E) \le 0.6 [eV].$$

4. The organic electroluminescence device according to claim 1, wherein the ionization potential Ip1 of the first compound and the ionization potential Ip2 of the second compound satisfy a relationship represented by a numerical expression:

$$0 \le Ip2 - Ip2 \le 0.75 [eV].$$

5. The organic electroluminescence device according to claim 1, wherein a luminescence quantum efficiency of the first compound is 70% or less.

6. The organic electroluminescence device according to claim 1, wherein a luminescence quantum efficiency of the first compound is 30% or more.

7. The organic electroluminescence device according to claim 1, wherein a concentration of the third compound in the emitting layer is less than 50 mass %.

8. The organic electroluminescence device according to claim 1, wherein a concentration of the third compound in the emitting layer is 30 mass % or less.

9. The organic electroluminescence device according to claim 1, wherein the emitting layer comprises no metal complex.

10. The organic electroluminescence device according to claim 1, wherein the emitting layer comprises no phosphorescent metal complex.

11. The organic electroluminescence device according to claim 1, wherein an emission peak wavelength of the second compound is 550 nm or less.

12. The organic electroluminescence device according to claim 1, wherein a delayed fluorescence ratio exceeds 37.5%.

13. An electronic device comprising the organic electroluminescence device according to claim 1.

* * * * *